(12) United States Patent
Sasaki et al.

(10) Patent No.: US 9,673,502 B2
(45) Date of Patent: Jun. 6, 2017

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Satoshi Sasaki, Nagaokakyo (JP); Nobuo Ikemoto, Nagaokakyo (JP); Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/285,615

(22) Filed: Oct. 5, 2016

(65) Prior Publication Data

US 2017/0025730 A1 Jan. 26, 2017

Related U.S. Application Data

(63) Continuation of application No. 14/503,612, filed on Oct. 1, 2014, now Pat. No. 9,490,513, which is a continuation of application No. PCT/JP2013/070722, filed on Jul. 31, 2013.

(30) Foreign Application Priority Data

Aug. 9, 2012 (JP) ................................ 2012-177209
Mar. 14, 2013 (JP) ................................ 2013-051436

(51) Int. Cl.
| H01P 3/08 | (2006.01) |
| H01P 3/00 | (2006.01) |
| H05K 1/02 | (2006.01) |
| H05K 1/03 | (2006.01) |
| H05K 1/14 | (2006.01) |

(52) U.S. Cl.
CPC ................ *H01P 3/003* (2013.01); *H01P 3/08* (2013.01); *H01P 3/085* (2013.01); *H05K 1/0253* (2013.01); *H05K 1/0225* (2013.01); *H05K 1/0284* (2013.01); *H05K 1/0393* (2013.01); *H05K 1/147* (2013.01); *H05K 2201/09245* (2013.01); *H05K 2201/09281* (2013.01); *H05K 2201/09727* (2013.01)

(58) Field of Classification Search
CPC .. H01P 3/08; H01P 3/081; H01P 3/082; H01P 3/085; H01P 3/088
USPC .................................................. 333/238, 246
See application file for complete search history.

(56) References Cited

PUBLICATIONS

Sasaki et al., "High-Frequency Signal Transmission Line and Electronic Device", U.S. Appl. No. 14/503,612, filed Oct. 1, 2014.

*Primary Examiner* — Stephen E Jones
(74) *Attorney, Agent, or Firm* — Keating & Bennett, LLP

(57) ABSTRACT

A dielectric element assembly includes a plurality of dielectric layers stacked on each other in a direction of lamination and extends in an x-axis direction. A signal line is provided in the dielectric element assembly and extends in the x-axis direction. A reference ground conductor is provided on a positive side in a z-axis direction relative to the signal line. An auxiliary ground conductor is provided on a negative side in the z-axis direction relative to the signal line. Via-hole conductors connect the reference ground conductor and the auxiliary ground conductor and are provided in the dielectric element assembly on the negative side relative to the center in a y-axis direction. A portion of the signal line in a section which includes the via-hole conductors is positioned on the positive side in the y-axis direction relative to another portion of the signal line in a section which does not include the via-hole conductors.

7 Claims, 17 Drawing Sheets

F I G. 4
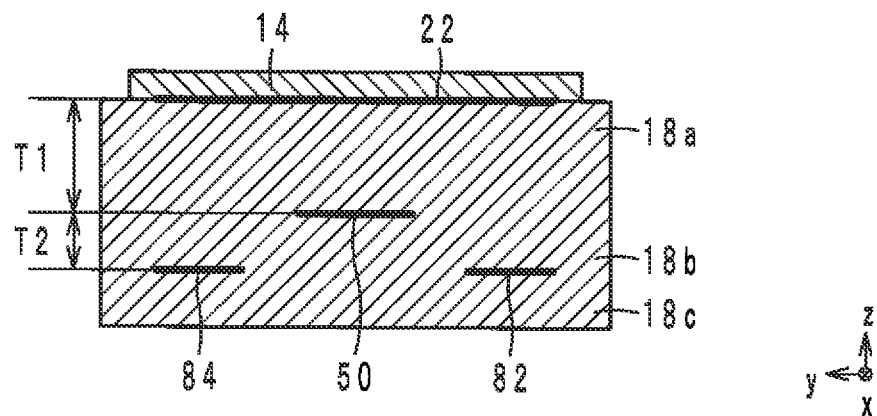
F I G. 5
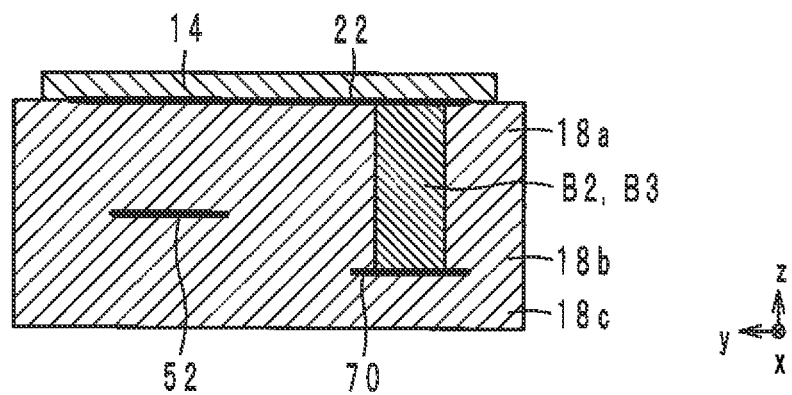

F I G. 7A
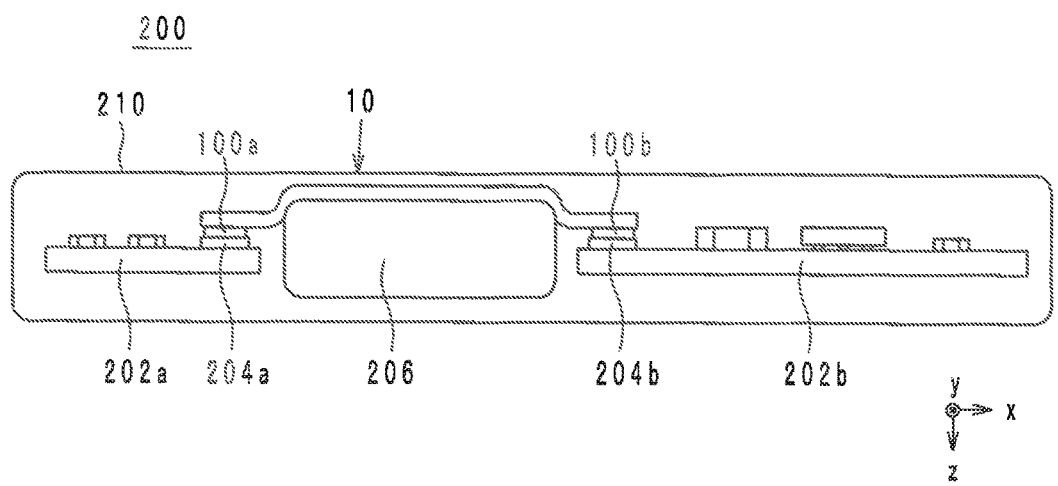
F I G. 7B
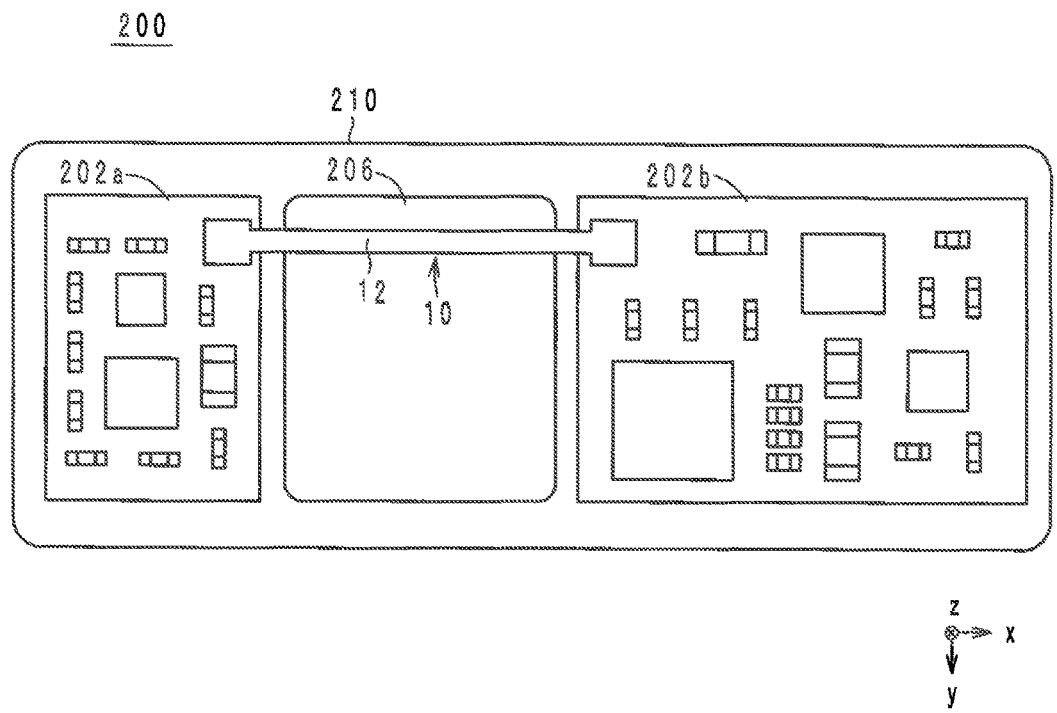

F I G. 15
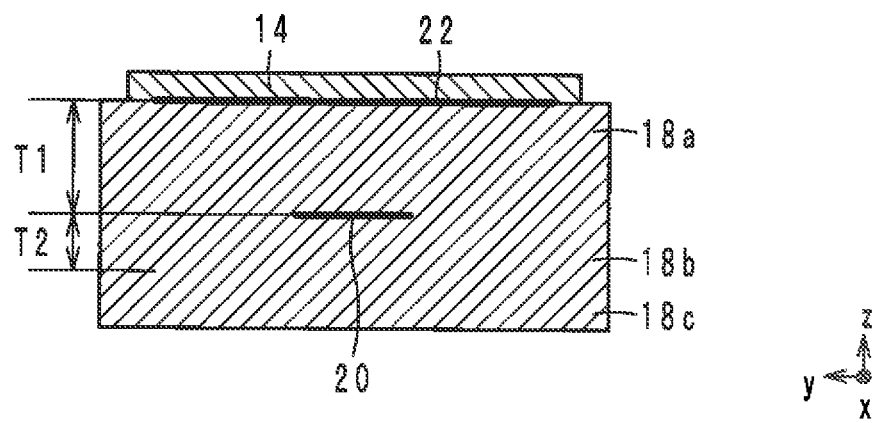
F I G. 16
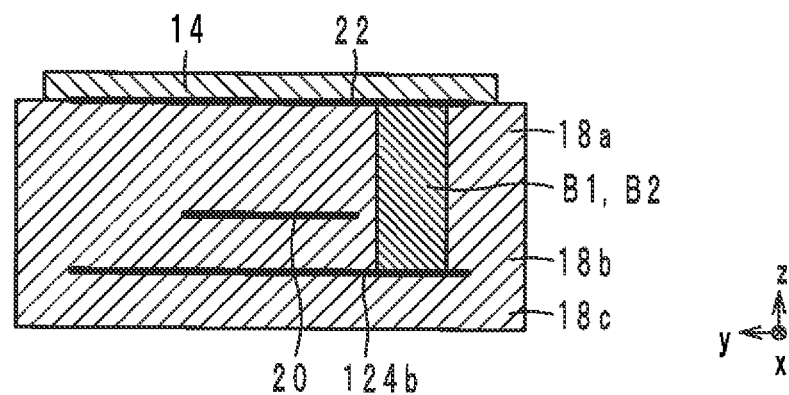

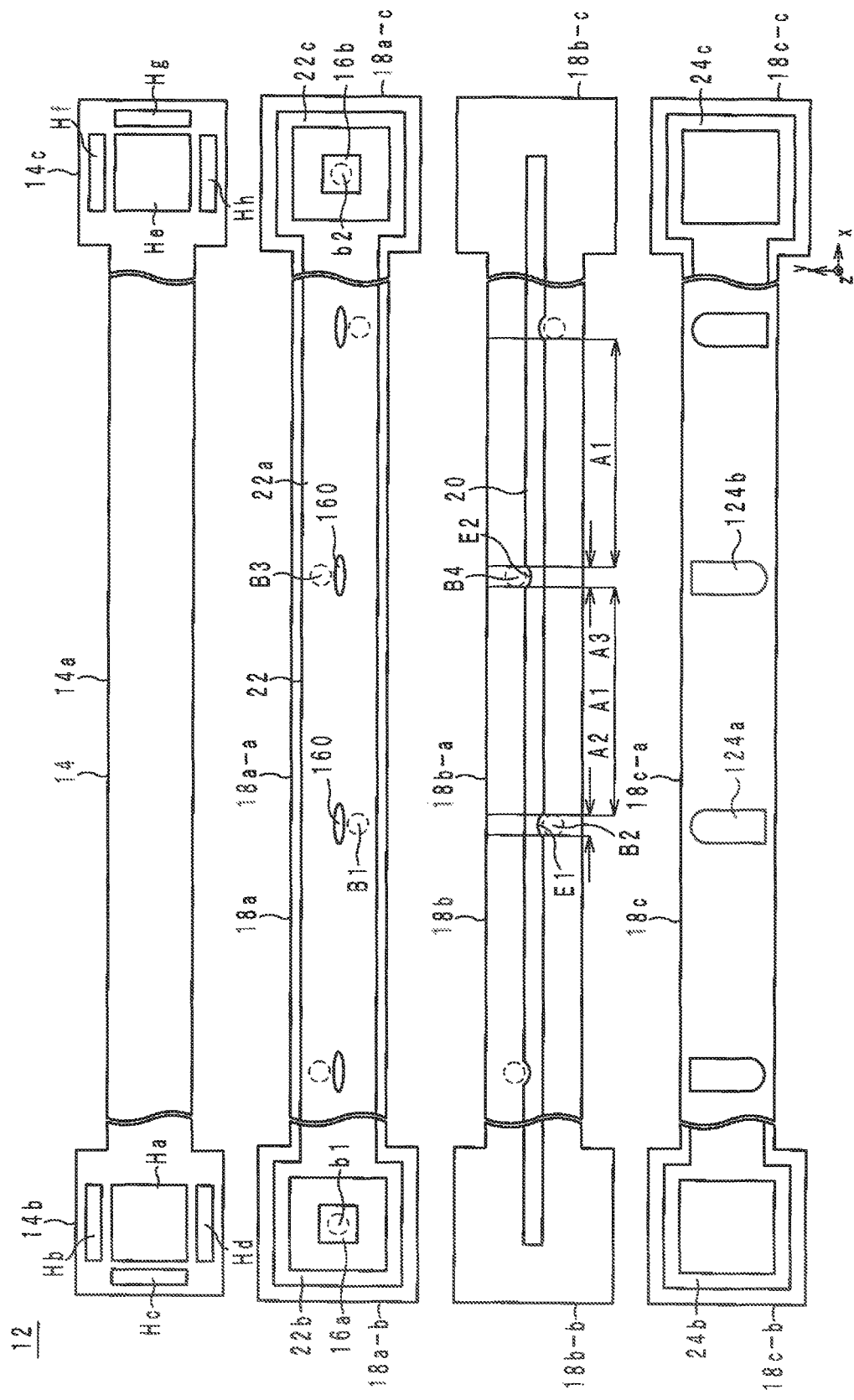

HIGH-FREQUENCY SIGNAL TRANSMISSION LINE AND ELECTRONIC DEVICE

This application is based on Japanese Patent Application No. 2012-177209 filed on Aug. 9, 2012, Japanese Patent Application No. 2013-051436 filed on Mar. 14, 2013, and International Application No. PCT/JP2013/070722 filed on Jul. 31, 2013, the entire contents of each of which are hereby incorporated herein by reference.

BACKGROUND OF THE INVENTION

1. Field of the Invention

The present invention relates to high-frequency signal transmission lines and electronic devices, more particularly to high-frequency signal transmission lines for transmission of high-frequency signals and electronic devices.

2. Description of the Related Art

One of known examples of an invention relating to the conventional high-frequency signal transmission lines is a high-frequency signal line disclosed in WO 2012/073591. This high-frequency signal line includes a dielectric element assembly, a signal line, two ground conductors, and via-hole conductors. The dielectric element assembly is formed by laminating a plurality of dielectric sheets. The signal line is provided inside the dielectric element assembly. The signal line is provided between the two ground conductors in terms of the direction of the lamination in the dielectric element assembly. The via-hole conductors pierce through the dielectric sheets in the direction of the lamination and connect together the two ground conductors. The two via-hole conductors are arranged along the width direction of the dielectric element assembly such that the signal line is provided between the via-hole conductors in the dielectric element assembly. With this arrangement, the signal line and the two ground conductors form a stripline structure.

Further, the ground conductors have a plurality of openings which overlap with the signal line when viewed in plan in the direction of the lamination. With this arrangement, capacitance is unlikely to be formed between the signal line and the ground conductors. Therefore, the distance in the direction of the lamination between the signal line and the ground conductors can be reduced, and the thickness of the high-frequency signal line can also be reduced. The high-frequency signal line having such a configuration is used for connection of two circuit boards.

The high-frequency signal line disclosed in WO 2012/073591 has difficulty in reducing the width of the dielectric element assembly as described below. More specifically, in the high-frequency signal line disclosed in WO 2012/073591, reduction of the width of the dielectric element assembly may be realized by, for example, reducing the diameter of the via-hole conductors. However, the minimum value of the diameter of the via-hole conductors is limited by the accuracy of the manufacturing process of the via-hole conductors. Therefore, there is a limitation in reducing the width of the dielectric element assembly by reducing the diameter of the via-hole conductors.

Reduction of the width of the dielectric element assembly may also be realized by, for example, reducing the width of the signal line. However, when the width of the signal line is reduced, the resistance value of the signal line increases, and the insertion loss of the high-frequency signal line also increases.

SUMMARY OF THE INVENTION

In view of the foregoing, preferred embodiments of the present invention provide a high-frequency signal transmission line and an electronic device in which a width of the dielectric element assembly is significantly reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a cross-sectional structure view taken along line A-A of FIG. 3.

FIG. 5 is a cross-sectional structure view taken along line B-B of FIG. 3.

FIG. 7A is a plan view of an electronic device including the high-frequency signal transmission line, which is viewed in plan in the y-axis direction. FIG. 7B is a plan view of the electronic device including the high-frequency signal transmission line, which is viewed in plan in the z-axis direction.

FIG. 15 is a cross-sectional structure view taken along line A-A of FIG. 14.

FIG. 16 is a cross-sectional structure view taken along line B-B of FIG. 14.

FIG. 19 is an exploded view of a high-frequency signal transmission line according to a ninth modification of a preferred embodiment of the present invention.

DETAILED DESCRIPTION OF THE PREFERRED EMBODIMENTS

Hereinafter, high-frequency signal transmission lines and electronic devices according to various preferred embodiments of the present invention and modifications thereof will be described with reference to the drawings.

Figure 1:
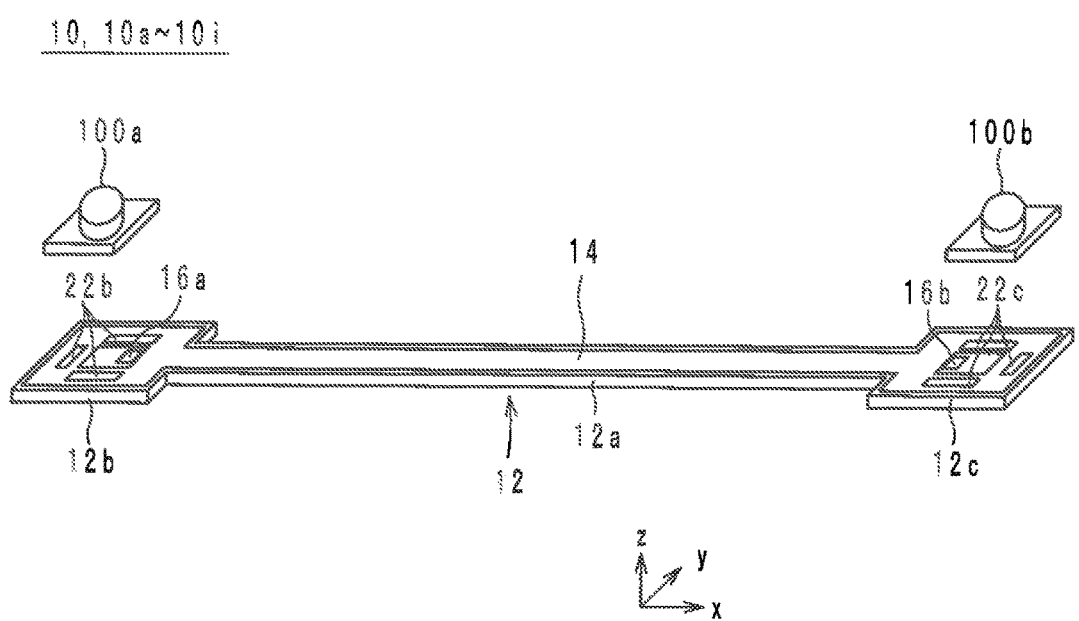
FIG. 1 is an external perspective view of a high-frequency signal transmission line according to a preferred embodiment of the present invention.
Figure 2:
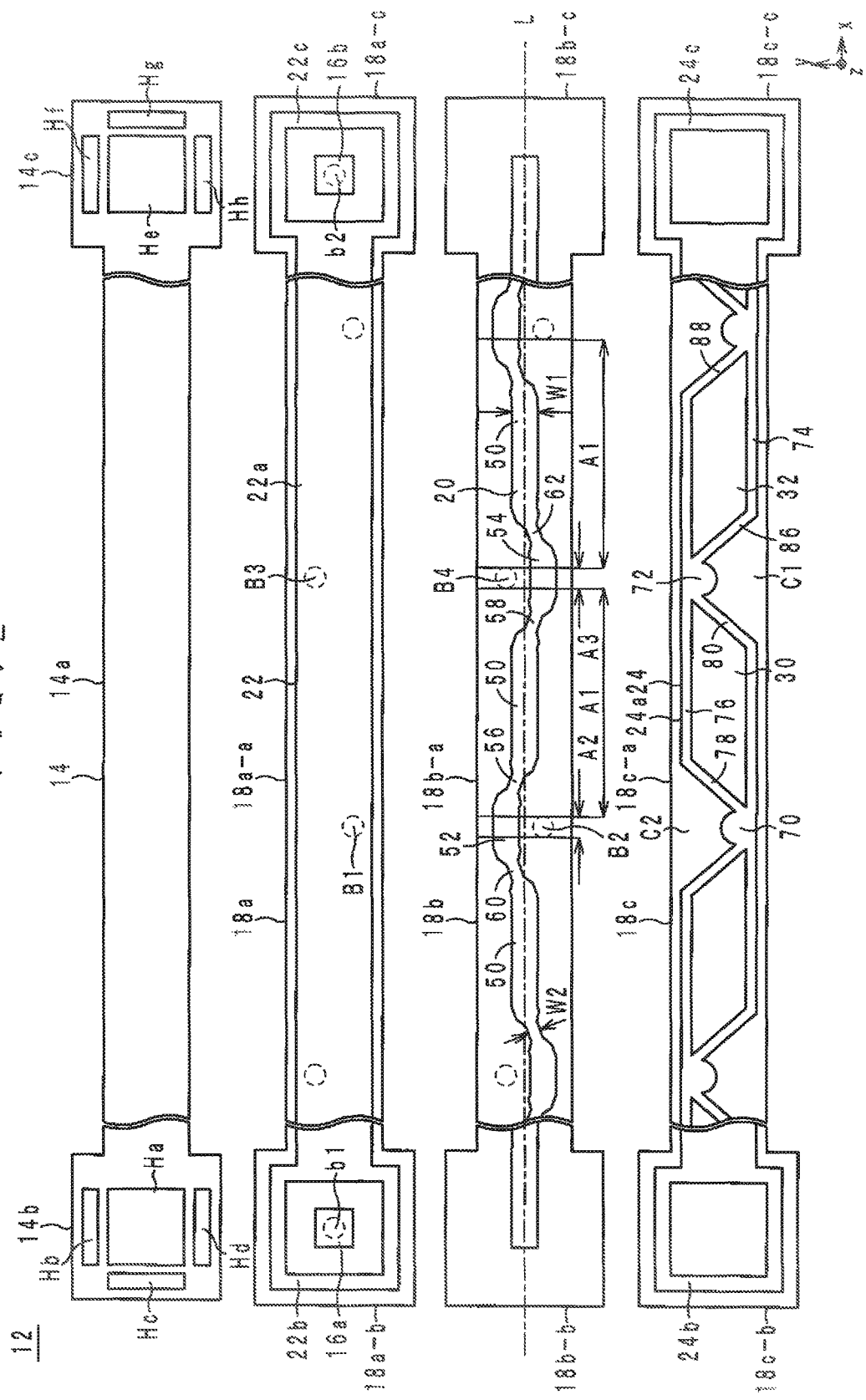
FIG. 2 is an exploded view of the high-frequency signal transmission line of FIG. 1.
Figure 3:
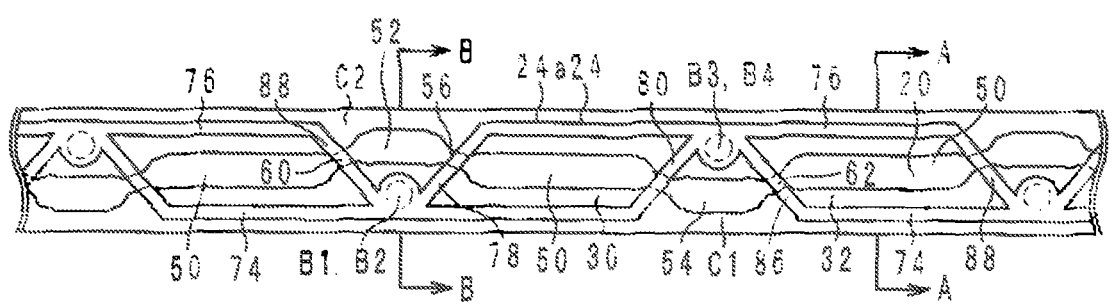
FIG. 3 is a see-through view of the high-frequency signal transmission line of FIG. 1 in which a signal line and an auxiliary ground conductor are shown.

Configurations of a high-frequency signal transmission line according to preferred embodiments of the present invention will be described below with reference to the drawings. FIG. 1 is an external perspective view of the high-frequency signal transmission line 10 according to a preferred embodiment of the present invention. FIG. 2 is an exploded view of the high-frequency signal transmission line 10 of FIG. 1. FIG. 3 is a see-through view of the high-frequency signal transmission line 10 of FIG. 1 in which a signal line 20 and an auxiliary ground conductor 24 are shown. FIG. 4 is a cross-sectional structure view taken along line A-A of FIG. 3. FIG. 5 is a cross-sectional structure view taken along line B-B of FIG. 3. In the following sections, the direction of the lamination of the high-frequency signal transmission line 10 is defined as a z-axis direction. The longitudinal direction of the high-frequency signal transmission line 10 is defined as an x-axis direction, and the direction perpendicular to the x-axis direction and to the z-axis direction is defined as a y-axis direction.

The high-frequency signal transmission line 10 is preferably used in, for example, an electronic device such as a cell phone, to connect two high-frequency circuits. The high-frequency signal transmission line 10 includes a dielectric element assembly 12, external terminals 16a, 16b, a signal line 20, a reference ground conductor (first ground conductor) 22, an auxiliary ground conductor (second ground conductor) 24, via-hole conductors (interlayer connecting portions) b1, b2, B1 to B4, and connectors 100a, 100b as shown in FIG. 1 and FIG. 2.

The dielectric element assembly 12 is a flexible plate-shaped element extending in the x-axis direction when viewed in a plan view in the z-axis direction as shown in FIG. 1. The dielectric element assembly 12 includes a line portion 12a, and connecting portions 12b, 12c. The dielectric element assembly 12 is a laminate preferably formed by laminating a protective layer and dielectric sheets 18a to 18c in this order, from the positive side to the negative side in the z-axis direction, as shown in FIG. 2. In the following, the principal surface of the dielectric element assembly 12 which is on the positive side in the z-axis direction is referred to as a top surface, and the principal surface of the dielectric element assembly 12 which is on the negative side in the z-axis direction is referred to as a bottom surface.

The line portion 12a extends in the x-axis direction as shown in FIG. 1. The connecting portions 12b, 12c are connected to an end of the line portion 12a on the negative side in the x-axis direction and the other end of the line portion 12a on the positive side in the x-axis direction, respectively. The connecting portions 12b, 12c preferably have a rectangular or substantially rectangular shape. The width in the y-axis direction of the connecting portions 12b, 12c is greater than the width in the y-axis direction of the line portion 12a.

The dielectric sheets 18a to 18c extend in the x-axis direction and preferably have the same shape as the dielectric element assembly 12 when viewed in a plan view in the z-axis direction as shown in FIG. 2. The dielectric sheets 18a to 18c are preferably made of a flexible thermoplastic resin such as polyimide or liquid crystal polymer. In the following, the principal surface of each of the dielectric sheets 18a to 18c which is on the positive side in the z-axis direction is referred to as top surface, and the principal surface of each of the dielectric sheets 18a to 18c which is on the negative side in the z-axis direction is referred to as a bottom surface.

The thickness T1 of the dielectric sheet 18a is greater than the thickness T2 of the dielectric sheet 18b as shown in FIG. 4 and FIG. 5. The thickness T1 preferably is about 50 μm to about 300 μm, for example, after the lamination of the dielectric sheets 18a to 18c. In the present preferred embodiment, the thickness T1 preferably is about 100 μm, for example. Moreover, the thickness T2 preferably is about 10 μm to about 100 μm, for example. In the present preferred embodiment, the thickness T2 preferably is about 50 μm, for example.

The dielectric sheet 18a includes a line portion 18a-a and connecting portions 18a-b, 18a-c as shown in FIG. 1 and FIG. 2. The dielectric sheet 18b includes a line portion 18b-a and connecting portions 18b-b, 18b-c. The dielectric sheet 18c includes a line portion 18c-a and connecting portions 18c-b, 18c-c. The line portions 18a-a, 18b-a, 18c-a constitute the line portion 12a. The connecting portions 18a-b, 18b-b, 18c-b constitute the connecting portion 12b. The connecting portions 18a-c, 18b-c, 18c-c constitute the connecting portion 12c.

The signal line 20 is a linear conductor through which high-frequency signals are transmitted and which is provided in the dielectric element assembly 12 as shown in FIG. 2. In the present preferred embodiment, the signal line 20 is preferably provided on the top surface of the dielectric sheet 18b. In the line portion 18b-a, the signal line 20 extends in the x-axis direction. An end of the signal line 20 on the negative side in the x-axis direction is present at the center of the connecting portion 18b-b as shown in FIG. 2. The other end of the signal line 20 on the positive side in the x-axis direction is present at the center of the connecting portion 18b-c as shown in FIG. 2. The signal line 20 is preferably made of a metal material mainly composed of silver or copper and having a low specific resistance, for example. Here, forming the signal line 20 on the top surface of the dielectric sheet 18b refers to forming the signal line 20 preferably by patterning a metal foil that is formed by plating on the top surface of the dielectric sheet 18b or forming the signal line 20 by patterning a metal foil that is adhered onto the top surface of the dielectric sheet 18b. Further, the surface of the signal line 20 is smoothed, and therefore, the surface roughness of a surface of the signal line 20 which is in contact with the dielectric sheet 18b is greater than the surface roughness of the other surface of the signal line 20 which is not in contact with the dielectric sheet 18b.

The reference ground conductor 22 is a solid conductor layer provided on the positive side in the z-axis direction relative to the signal line 20 as shown in FIG. 2. More specifically, the reference ground conductor 22 is preferably arranged on the top surface of the dielectric sheet 18a so as to be opposed to the signal line 20 with the dielectric sheet 18a positioned therebetween. The reference ground conductor 22 does not have an opening at a position overlapping with the signal line 20. The reference ground conductor 22 is made of a metal material mainly composed of silver or copper and having a low specific resistance. Here, forming the reference ground conductor 22 on the top surface of the dielectric sheet 18a refers to forming the reference ground conductor 22 preferably by patterning a metal foil that is formed by plating on the top surface of the dielectric sheet 18a or forming the reference ground conductor 22 by patterning a metal foil that is adhered onto the top surface of the dielectric sheet 18a. Further, the surface of the reference ground conductor 22 is smoothed, and therefore, the surface roughness of a surface of the reference ground conductor 22 which is in contact with the dielectric sheet 18a is greater than the surface roughness of the other surface of the reference ground conductor 22 which is not in contact with the dielectric sheet 18a.

The reference ground conductor 22 includes a line portion 22a and terminal portions 22b, 22c as shown in FIG. 2. The line portion 22a is provided on the top surface of the line portion 18a-a so as to extend in the x-axis direction. The terminal portion 22b is provided on the top surface of the line portion 18a-b and preferably is in the form of a rectangular or substantially rectangular rim. The terminal portion 22b is connected to the end of the line portion 22a on the negative side in the x-axis direction. The terminal portion 22c is provided on the top surface of the line portion 18a-c and preferably is in the form of a rectangular or substantially rectangular rim. The terminal portion 22c is connected to the end of the line portion 22a on the positive side in the x-axis direction.

The auxiliary ground conductor 24 is provided on the negative side in the z-axis direction relative to the signal line as shown in FIG. 2. The auxiliary ground conductor 24 includes a plurality of openings 30, 32 which are arranged along the signal line 20. More specifically, the auxiliary ground conductor 24 is preferably arranged on the top surface of the dielectric sheet 18c so as to be opposed to the signal line 20 with the dielectric sheet 18b positioned therebetween. The auxiliary ground conductor 24 preferably is made of a metal material mainly composed of silver or copper and having a low specific resistance, for example. Here, forming the auxiliary ground conductor 24 on the top surface of the dielectric sheet 18c refers to forming the auxiliary ground conductor 24 preferably by patterning a metal foil that is formed by plating on the top surface of the dielectric sheet 18c or forming the auxiliary ground conductor 24 by patterning a metal foil that is adhered onto the top surface of the dielectric sheet 18c. Further, the surface of the auxiliary ground conductor 24 is smoothed, and therefore, the surface roughness of a surface of the auxiliary ground conductor 24 which is in contact with the dielectric sheet 18c is greater than the surface roughness of the other surface of the auxiliary ground conductor 24 which is not in contact with the dielectric sheet 18c.

The auxiliary ground conductor 24 includes a line portion 24a and terminal portions 24b, 24c as shown in FIG. 2. The line portion 24a is provided on the top surface of the line portion 18c-a so as to extend in the x-axis direction. The terminal portion 24b is provided on the top surface of the line portion 18c-b and preferably is in the form of a rectangular or substantially rectangular rim. The terminal portion 24b is connected to the end of the line portion 24a on the negative side in the x-axis direction. The terminal portion 24c is provided on the top surface of the line portion 18c-c and preferably is in the form of a rectangular or substantially rectangular rim. The terminal portion 24c is connected to the end of the line portion 24a on the positive side in the x-axis direction.

The line portion 24a includes a plurality of openings 30, 32 preferably in the form of a parallelogram elongated in the x-axis direction as shown in FIG. 2. More specifically, the line portion 24a includes a plurality of connecting portions 70, 72, side portions 74, 76, and a plurality of bridge portions 78, 80, 86, 88. The side portion 74 is a linear conductor which defines a side portion of the line portion 24a on the negative side in the y-axis direction and which extends in the x-axis direction. The side portion 76 is a linear conductor which defines a side portion of the line portion 24a on the positive side in the y-axis direction and which extends in the x-axis direction. The plurality of connecting portions 70 protrude from the side portion 74 to the positive side in the y-axis direction and preferably has a semicircular or substantially semicircular shape. The plurality of connecting portions 70 are arranged in a row in the x-axis direction with equal intervals. The plurality of connecting portions 72 protrude from the side portion 76 to the negative side in the y-axis direction and preferably has a semicircular or substantially semicircular shape. The plurality of connecting portions 72 are arranged in a row in the x-axis direction with equal intervals. The connecting portions 70 and the connecting portions 72 are provided at different positions in terms of the x-axis direction. In the present preferred embodiment, the connecting portions 70 and the connecting portions 72 are arranged alternately in the x-axis direction. The connecting portion 72 resides at the midpoint in the x-axis direction between two connecting portions 70 which are adjacent to each other in the x-axis direction. The connecting portion 70 resides at the midpoint in the x-axis direction between two connecting portions 72 which are adjacent to each other in the x-axis direction.

The bridge portion 78 is a linear conductor obliquely extending toward the positive side in the x-axis direction while extending from the connecting portion 70 toward the positive side in the y-axis direction. The bridge portion 78 is connected to the side portion 76. The bridge portion 80 is a linear conductor obliquely extending toward the negative side in the x-axis direction while extending from the connecting portion 72 toward the negative side in the y-axis direction. The bridge portion 80 is connected to the side portion 74. The bridge portion 78 and the bridge portion 80 are parallel or substantially parallel to each other. Thus, the opening 30 is preferably provided in a region enclosed by the side portions 74, 76 and the bridge portions 78, 80.

The bridge portion 86 is a linear conductor obliquely extending toward the positive side in the x-axis direction while extending from the connecting portion 72 toward the negative side in the y-axis direction. The bridge portion 86 is connected to the side portion 74. The bridge portion 88 is a linear conductor obliquely extending toward the negative side in the x-axis direction while extending from the connecting portion 70 toward the positive side in the y-axis direction. The bridge portion 88 is connected to the side portion 76. The bridge portion 86 and the bridge portion 88 are parallel or substantially parallel to each other. Thus, the opening 32 is preferably provided in a region enclosed by the side portions 74, 76 and the bridge portion 86, 88.

The side portion 74 of the line portion 24a includes a cutout portion C1. The cutout portion C1 is provided in the line portion 24a, at a position on the negative side in the y-axis direction relative to the connecting portion 72. Thus, at the cutout portion C1, the side portion 74 is separated.

The side portion 76 of the line portion 24a includes a cutout portion C2. The cutout portion C2 is provided in the line portion 24a, at a position on the positive side in the y-axis direction relative to the connecting portion 70. Thus, at the cutout portion C2, the side portion 76 is separated.

The external terminal 16a is a rectangular or substantially rectangular conductor which is preferably provided at or substantially at the center of the top surface of the connecting portion 18a-b as shown in FIG. 2. Thus, when viewed in plan in the z-axis direction, the external terminal 16a overlaps with the end of the signal line 20 on the negative side in the x-axis direction. The external terminal 16b is a rectangular or substantially rectangular conductor which is preferably provided at or substantially at the center of the top surface of the connecting portion 18*a-c* as shown in FIG. 2. Thus, when viewed in plan in the z-axis direction, the external terminal 16*b* overlaps with the other end of the signal line 20 on the positive side in the x-axis direction. The external terminals 16*a*, 16*b* are preferably made of a metal material mainly composed of silver or copper and having a low specific resistance. Further, the top surface of the external terminals 16*a*, 16*b* is plated with Ni/Au. Here, forming the external terminals 16*a*, 16*b* on the top surface of the dielectric sheet 18*a* refers to forming the external terminals 16*a*, 16*b* preferably by patterning a metal foil that is formed by plating on the top surface of the dielectric sheet 18*a* or forming the external terminals 16*a*, 16*b* by patterning a metal foil that is adhered onto the top surface of the dielectric sheet 18*a*. Further, the surface of the external terminals 16*a*, 16*b* is smoothed, and therefore, the surface roughness of a surface of the external terminals 16*a*, 16*b* which is in contact with the dielectric sheet 18*a* is greater than the surface roughness of the other surface of the external terminals 16*a*, 16*b* which is not in contact with the dielectric sheet 18*a*.

As described above, the signal line 20 is positioned between the reference ground conductor 22 and the auxiliary ground conductor 24 in terms of the z-axis direction. That is, the signal line 20, the reference ground conductor 22, and the auxiliary ground conductor 24 define a tri-plate stripline structure. The space (the distance in the z-axis direction) between the signal line 20 and the reference ground conductor 22 preferably is equal or approximately equal to the thickness T1 of the dielectric sheet 18*a* as shown in FIG. 4, and preferably is about 50 µm to about 300 µm, for example. In the present preferred embodiment, the space between the signal line 20 and the reference ground conductor 22 preferably is about 100 µm, for example. On the other hand, the space (the distance in the z-axis direction) between the signal line 20 and the auxiliary ground conductor 24 preferably is equal or approximately equal to the thickness T2 of the dielectric sheet 18*b* as shown in FIG. 4, and preferably is about 10 µm to about 100 µm, for example. In the present preferred embodiment, the space between the signal line 20 and the auxiliary ground conductor 24 preferably is about 50 µm, for example. That is, the distance in the z-axis direction between the auxiliary ground conductor 24 and the signal line 20 preferably is designed to be smaller than the distance in the z-axis direction between the reference ground conductor 22 and the signal line 20.

The via-hole conductor b1 pierces through the connecting portion 18*a-b* of the dielectric sheet 18*a* in the z-axis direction as shown in FIG. 2 and connects the external terminal 16*a* to the end of the signal line 20 on the negative side in the x-axis direction. The via-hole conductor b2 pierces through the connecting portion 18*a-c* of the dielectric sheet 18*a* in the z-axis direction as shown in FIG. 2 and connects the external terminal 16*b* to the other end of the signal line 20 on the positive side in the x-axis direction. Thus, the signal line is connected between the external terminals 16*a*, 16*b*. The via-hole conductors b1, b2 are formed preferably by providing a metal material into through holes formed in the dielectric sheet 18*a*.

The plurality of via-hole conductors B1 pierce through the line portion 18*a-a* in the z-axis direction at positions on the negative side in the y-axis direction relative to the signal line 20, and are arranged in a row in the x-axis direction, as shown in FIG. 2 and FIG. 3. The plurality of via-hole conductors B2 pierce through the line portion 18*b-a* in the z-axis direction at positions on the negative side in the y-axis direction relative to the signal line 20, and are arranged in a row in the x-axis direction, as shown in FIG. 2 and FIG. 3. In the present preferred embodiment, the via-hole conductors B1, B2 are provided on the negative side in the y-axis direction relative to the center line L in the y-axis direction (width direction) of the high-frequency signal transmission line 10. The via-hole conductor B1 and the via-hole conductor B2 are connected to each other to form a single via-hole conductor. An end of the via-hole conductor B1 on the positive side in the z-axis direction is connected to the reference ground conductor 22, and an end of the via-hole conductor B2 on the negative side in the z-axis direction is connected to the connecting portions 70. Thus, the via-hole conductors B1, B2 connect together the reference ground conductor 22 and the auxiliary ground conductor 24. The via-hole conductors B1, B2 are formed preferably by providing a metal material into through holes formed in the dielectric sheets 18*a*, 18*b*. Hereinafter, a section of the high-frequency signal transmission line 10 which includes the via-hole conductors B1, B2 is referred to as "section A2". In the high-frequency signal transmission line 10, the section A2 refers to a region which overlaps with the via-hole conductors B1, B2 in terms of the y-axis direction.

The plurality of via-hole conductors B3 pierce through the line portion 18*a-a* in the z-axis direction at positions on the positive side in the y-axis direction relative to the signal line 20, and are arranged in a row in the x-axis direction, as shown in FIG. 2 and FIG. 3. The plurality of via-hole conductors B4 pierce through the line portion 18*b-a* in the z-axis direction at positions on the positive side in the y-axis direction relative to the signal line 20, and are arranged in a row in the x-axis direction, as shown in FIG. 2 and FIG. 3. In the present preferred embodiment, the via-hole conductors B3, B4 are provided on the positive side in the y-axis direction relative to the center line L in the y-axis direction (width direction) of the high-frequency signal transmission line 10. The via-hole conductor B3 and the via-hole conductor B4 are connected to each other to provide a single via-hole conductor. An end of the via-hole conductor B3 on the positive side in the z-axis direction is connected to the reference ground conductor 22, and an end of the via-hole conductor B4 on the negative side in the z-axis direction is connected to the connecting portions 72. Thus, the via-hole conductors B3, B4 connect together the reference ground conductor 22 and the auxiliary ground conductor 24. The via-hole conductors B3, B4 are formed preferably by providing a metal material into through holes formed in the dielectric sheets 18*a*, 18*b*. Hereinafter, a section of the high-frequency signal transmission line 10 which includes the via-hole conductors B3, B4 is referred to as "section A3". The section A3 refers to a region which overlaps with the via-hole conductors B3, B4 in terms of the y-axis direction.

The via-hole conductors B1, B2 and the via-hole conductors B3, B4 are provided at different positions in terms of the x-axis direction. In the present preferred embodiment, the via-hole conductors B1, B2 and the via-hole conductors B3, B4 are arranged alternately in the x-axis direction. The via-hole conductor B1, B2 resides at the midpoint in the x-axis direction between two via-hole conductors B3, B4 which are adjacent to each other in the x-axis direction. The via-hole conductor B3, B4 resides at the midpoint in the x-axis direction between two via-hole conductors B1, B2 which are adjacent to each other in the x-axis direction.

In the high-frequency signal transmission line 10, a section lying between the section A2 and the section A3 is referred to as "section A1". The section A1 is a section which does not include any of the via-hole conductors B1 to B4.

The signal line 20 meanders as shown in FIG. 2. More specifically, a portion of the signal line 20 lying in the section A1 is positioned on the negative side in the y-axis direction relative to a portion of the signal line 20 lying in the section A2. Further, a portion of the signal line 20 lying in the section A1 is positioned on the positive side in the y-axis direction relative to portion of the signal line 20 lying in the section A3. With this arrangement, the signal line 20 makes a detour around the via-hole conductors B1, B2 and the via-hole conductors B3, B4.

The signal line 20 includes wide line portions 50, 52, 54 and narrow line portions 56, 58, 60, 62. The width of the wide line portions 50, 52, 54 is width W1. The width of the narrow line portions 56, 58, 60, 62 is width W2. The width W1 is greater than the width W2. In the section A1, the wide line portion 50 extends in the x-axis direction on the center line L in the y-axis direction of the line portion 18b-a. When viewed in plan in the z-axis direction, the wide line portion 50 overlaps with the openings 30, 32. Thus, the wide line portion 50 does not overlap with the auxiliary ground conductor 24 when viewed in plan in the z-axis direction.

The wide line portion 52 in the section A2 extends in the x-axis direction in a region on the positive side in the y-axis direction relative to the center line L in the y-axis direction of the line portion 18b-a. Note that, however, the opposite ends in the x-axis direction of the wide line portion 52 stretch into the section A1. The wide line portion 52 overlaps with the cutout portion C2 when viewed in plan in the z-axis direction. Thus, the wide line portion 52 does not overlap with the auxiliary ground conductor 24 when viewed in plan in the z-axis direction.

The wide line portion 54 in the section A3 extends in the x-axis direction in a region on the negative side in the y-axis direction relative to the center line L in the y-axis direction of the line portion 18b-a. Note that, however, the opposite ends in the x-axis direction of the wide line portion 52 stretch into the section A1. The wide line portion 54 overlaps with the cutout portion C1 when viewed in plan in the z-axis direction. Thus, the wide line portion 54 does not overlap with the auxiliary ground conductor 24 when viewed in plan in the z-axis direction. The opposite ends of the wide line portions 50, 52, 54 that have the above-described configuration are tapered.

The narrow line portion 56 in the section A1 connects an end of the wide line portion 52 on the positive side in the x-axis direction to an end of the wide line portion 50 on the negative side in the x-axis direction. The narrow line portion obliquely extends toward the positive side in the x-axis direction while extending toward the negative side in the y-axis direction. The narrow line portion 56 overlaps with the bridge portion 78 when viewed in plan in the y-axis direction as shown in FIG. 3.

The narrow line portion 58 in the section A1 connects an end of the wide line portion 50 on the positive side in the x-axis direction to an end of the wide line portion 54 on the negative side in the x-axis direction. The narrow line portion obliquely extends toward the positive side in the x-axis direction while extending toward the negative side in the y-axis direction. The narrow line portion 58 overlaps with the bridge portion 80 when viewed in plan in the y-axis direction as shown in FIG. 3.

The narrow line portion 60 in the section A1 connects the end of the wide line portion 50 on the positive side in the x-axis direction to an end of the wide line portion 52 on the negative side in the x-axis direction. The narrow line portion obliquely extends toward the positive side in the x-axis direction while extending toward the positive side in the y-axis direction. The narrow line portion 60 overlaps with the bridge portion 88 when viewed in plan in the y-axis direction as shown in FIG. 3.

The narrow line portion 62 in the section A1 connects an end of the wide line portion 54 on the positive side in the x-axis direction to the end of the wide line portion 50 on the negative side in the x-axis direction. The narrow line portion obliquely extends toward the positive side in the x-axis direction while extending toward the positive side in the y-axis direction. The narrow line portion 62 overlaps with the bridge portion 86 when viewed in plan in the y-axis direction as shown in FIG. 3.

The protective layer 14 is an insulative film covering generally the entire top surface of the dielectric sheet 18a. Thus, the protective layer 14 covers the reference ground conductor 22. The protective layer 14 is made of a flexible resin, such as a resist material or the like.

The protective layer 14 includes a line portion 14a and connecting portions 14b, 14c as shown in FIG. 2. The line portion 14a covers the entire top surface of the line portion 18a-a, thus covering the line portion 22a.

The connecting portion 14b is connected to an end of the line portion 14a on the negative side in the x-axis direction, and covers the top surface of the connecting portion 18a-b. Note that, however, the connecting portion 14b includes openings Ha to Hd. The opening Ha is a rectangular or substantially rectangular opening provided at or substantially at the center of the connecting portion 14b. The external terminal 16a is exposed to the outside via the opening Ha. The opening Hb is a rectangular or substantially rectangular opening provided on the positive side in the y-axis direction relative to the opening Ha. The opening Hc is a rectangular or substantially rectangular opening provided on the negative side in the x-axis direction relative to the opening Ha. The opening Hd is a rectangular or substantially rectangular opening provided on the negative side in the y-axis direction relative to the opening Ha. The terminal portion 22b is exposed to the outside via the openings Hb to Hd and therefore defines and functions as an external terminal.

The connecting portion 14c is connected to an end of the line portion 14a on the positive side in the x-axis direction, and covers the top surface of the connecting portion 18a-c. Note that, however, the connecting portion 14c includes openings He to Hh. The opening He is a rectangular or substantially rectangular opening provided at or substantially at the center of the connecting portion 14c. The external terminal 16b is exposed to the outside via the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside via the openings Hf to Hh and therefore defines and functions as an external terminal.

In the high-frequency signal transmission line 10 that has the above-described configuration, the characteristic impedance of the signal line 20 periodically varies between impedance Z1 and impedance Z2. More specifically, in portions of the signal line 20 overlapping with the openings 30, 32 and the cutout portions C1, C2, relatively small capacitance is provided between the signal line 20 and the auxiliary ground conductor 24. Therefore, the characteristic impedance of the portions of the signal line 20 overlapping with the openings 30, 32 and the cutout portions C1, C2 is relatively high impedance Z1.

On the other hand, in portions of the signal line 20 overlapping with the bridge portions 78, 80, 86, 88, relatively large capacitance is provided between the signal line 20 and the auxiliary ground conductor 24. Therefore, the characteristic impedance of the portions of the signal line 20 overlapping with the bridge portions 78, 80, 86, 88 is relatively low impedance Z2. The bridge portion 78, the opening 30, the bridge portion 80, the cutout portion C1, the bridge portion 86, the opening 32, the bridge portion 88, and the cutout portion C2 are arranged in this order in the x-axis direction. Thus, the characteristic impedance of the signal line 20 periodically varies between impedance Z1 and impedance Z2. The impedance Z1 preferably is about 55Ω, for example, and the impedance Z2 preferably is about 45Ω, for example. The average characteristic impedance across the entire signal line 20 preferably is about 50Ω, for example.

Figure 6A:
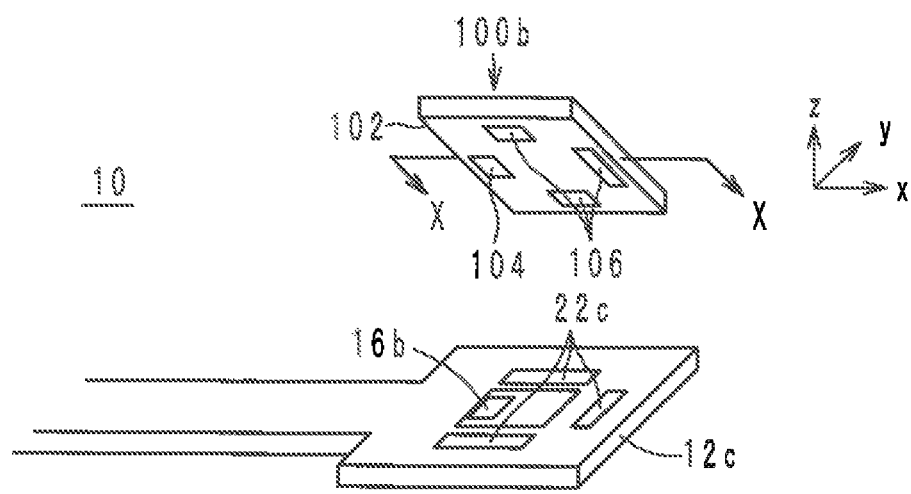
FIG. 6A is an external perspective view of a connector of the high-frequency signal transmission line.
Figure 6B:
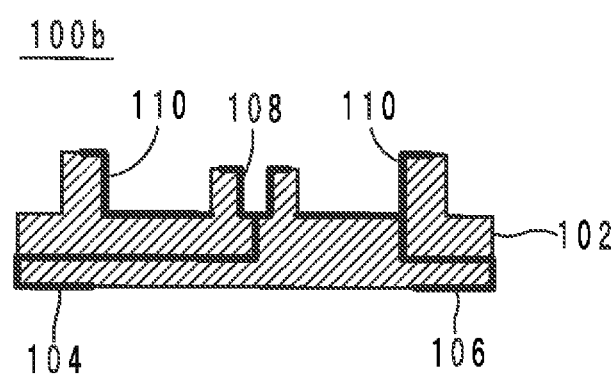
FIG. 6B is a cross-sectional structure view of the connector of the high-frequency signal transmission line.

The connectors 100a, 100b are mounted on the top surfaces of the connecting portions 12b, 12c, respectively, as shown in FIG. 1. Since the connectors 100a, 100b preferably have the same configuration, the configuration of the connector 100b is described below as an example. FIG. 6A is an external perspective view of the connector 100b of the high-frequency signal transmission line 10. FIG. 6B is a cross-sectional structure view of the connector 100b of the high-frequency signal transmission line 10.

The connector 100b includes a connector body 102, external terminals 104, 106, a center conductor 108, and an external conductor 110 as shown in FIG. 1, FIG. 6A, and FIG. 6B. The connector body 102 includes a rectangular or substantially rectangular plate member and a cylindrical or substantially cylindrical member coupled thereon, and is made of an insulating material such as a resin.

The external terminal 104 is positioned on a surface of the plate member of the connector body 102 on the negative side in the z-axis direction so as to face the external terminal 16b. The external terminal 106 is positioned on the surface of the plate member of the connector body 102 on the negative side in the z-axis direction so as to correspond to portions of the terminal portion 22c which are exposed through the openings Hf to Hh.

The center conductor 108 is positioned at or substantially at the center of the cylindrical member of the connector body 102 and is connected to the external terminal 104. The center conductor 108 is a signal terminal to/from which high-frequency signals are to be input/output. The external conductor 110 is positioned on the inner circumferential surface of the cylindrical member of the connector body 102, and is connected to the external terminal 106. The external conductor 110 is a ground terminal to be kept at a ground potential.

The connector 100b thus configured is mounted on the top surface of the connecting portion 12c such that the external terminal 104 is connected to the external terminal 16b and the external terminal 106 is connected to the terminal portion 22c as shown in FIG. 6A and FIG. 6B. As a result, the signal line 20 is electrically coupled to the center conductor 108. The reference ground conductor 22 and the auxiliary ground conductor 24 are electrically coupled to the external conductor 110.

The high-frequency signal transmission line 10 preferably is used as described below. FIG. 7A is a plan view of an electronic device 200 including the high-frequency signal transmission line 10, which is viewed in plan in the y-axis direction. FIG. 7B is a plan view of the electronic device 200 including the high-frequency signal transmission line 10, which is viewed in plan in the z-axis direction.

The electronic device 200 includes the high-frequency signal transmission line 10, circuit boards 202a, 202b, receptacles 204a, 204b, a battery pack (metallic body) 206, and a housing 210.

The housing 210 encloses the high-frequency signal transmission line 10, the circuit boards 202a, 202b, the receptacles 204a, 204b, and the battery pack 206. The circuit board 202a includes, for example, a transmission or reception circuit including an antenna. The circuit board 202b includes, for example, a power circuit. The battery pack 206 is, for example, a lithium-ion rechargeable battery, and the surface of the battery pack 206 is covered with a metal cover. The circuit board 202a, the battery pack 206, and the circuit board 202b are arranged in this order, from the negative side to the positive side in the x-axis direction.

The receptacles 204a, 204b are provided on the principal surfaces of the circuit boards 202a, 202b, respectively, at positions on the negative side in the z-axis direction. The receptacles 204a, 204b are connected to the connectors 100a and 100b, respectively. With this arrangement, high-frequency signals to be transmitted between the circuit boards 202a, 202b at a frequency of, for example, 2 GHz are applied to the center conductors 108 of the connectors 100a, 100b via the receptacles 204a, 204b, respectively. Moreover, the external conductors 110 of the connectors 100a, 100b are kept at a ground potential via the circuit boards 202a, 202b and the receptacles 204a, 204b. With this arrangement, the high-frequency signal transmission line 10 defines a connection between the circuit boards 202a, 202b.

Here, the top surface of the dielectric element assembly 12 (more precisely, the protective layer 14) is in contact with the battery pack 206. The dielectric element assembly 12 and the battery pack 206 are secured together by an adhesive agent, or the like. The top surface of the dielectric element assembly 12 is a principal surface which is at the reference ground conductor 22 side relative to the signal line 20. Therefore, the reference ground conductor 22 in a solid form is present between the signal line 20 and the battery pack 206.

Hereinafter, a non-limiting example of a manufacturing method of the high-frequency signal transmission line 10 is described with reference to FIG. 2. In the following section, manufacture of a single high-frequency signal transmission line 10 is described as an example although, in actuality, large-sized dielectric sheets are laminated and cut, such that a plurality of high-frequency signal transmission lines 10 are manufactured simultaneously.

First, dielectric sheets 18a to 18c are prepared which are made of a thermoplastic resin and whose top surfaces are entirely covered with a copper foil (metal film). Specifically, a copper foil is adhered onto the top surfaces of the dielectric sheets 18a to 18c. Further, the copper-foiled top surfaces of the dielectric sheets 18a to 18c are, for example, galvanized for anti-corrosion purposes and are thus smoothened. The dielectric sheets 18a to 18c are made of a liquid crystal polymer. The thickness of the copper foil preferably is about 10 μm to about 20 μm, for example.

Then, the copper foil formed on the top surface of the dielectric sheet 18a is patterned, such that the external terminals 16a, 16b and the reference ground conductor 22 shown in FIG. 2 are formed on the top surface of the dielectric sheet 18a. Specifically, a resist is printed on the copper foil on the top surface of the dielectric sheet 18a. Here, the resist preferably has the same pattern as the external terminals 16a, 16b and the reference ground conductor 22 shown in FIG. 2. Then, etching is performed on the copper foil such that portions of the copper foil which are not covered with the resist are removed. Thereafter, a resist solution is sprayed to remove the resist. In this way, the external terminals 16a, 16b and the reference ground conductor 22 such as shown in FIG. 2 are photolithographically formed on the top surface of the dielectric sheet 18a.

Then, the signal line 20 shown in FIG. 2 is formed on the top surface of the dielectric sheet 18b. Then, the auxiliary ground conductor 24 shown in FIG. 2 is formed on the top surface of the dielectric sheet 18c. Note that the steps of forming the signal line 20 and the auxiliary ground conductor 24 preferably are the same as the steps of forming the external terminals 16a, 16b and the reference ground conductor 22, and therefore, the description thereof is omitted.

Then, portions of the dielectric sheets 18a, 18b at which the via-hole conductors b1, b2, B1 to B4 are to be formed are irradiated with a laser beam such that through holes are formed. Then, an electrically-conductive paste is provided in the through holes to form the via-hole conductors b1, b2, B1 to B4.

Then, the dielectric sheets 18a to 18c are stacked in this order from the positive side to the negative side in the z-axis direction, such that the dielectric element assembly 12 is formed. Then, heat and pressure are applied to the dielectric sheets 18a to 18c at the positive and negative sides in the z-axis direction, such that the dielectric sheets 18a to 18c are united together.

Then, a resin (resist) paste is applied by screen printing to form the protective layer 14 over the top surface of the dielectric sheet 18a so as to cover the reference ground conductor 22.

Lastly, the connectors 100a, 100b are mounted onto the external terminals 16a, 16b and the terminal portions 22b, 22c lying on the connecting portions 12b, 12c using a solder. As a result, the high-frequency signal transmission line 10 shown in FIG. 1 is provided.

According to the high-frequency signal transmission line 10 that has the above-described configuration, the width in the y-axis direction of the dielectric element assembly 12 is significantly reduced. More specifically, in the high-frequency signal transmission line 10, the via-hole conductors B1, B2 are provided on the negative side in the y-axis direction relative to the center line L in the y-axis direction in the dielectric element assembly 12. Further, portion of the signal line 20 lying in the section A2 which includes the via-hole conductors B1, B2 is positioned on the positive side in the y-axis direction relative to portion of the signal line 20 lying in the section A1 which does not include the via-hole conductors B1, B2. That is, the signal line 20 makes a detour around the via-hole conductors B1, B2 when viewed in plan in the z-axis direction. Thus, the via-hole conductors B1, B2 are located closer to the center line L.

In the dielectric element assembly 12, the via-hole conductors B3, B4 are provided on the positive side in the y-axis direction relative to the center line L of the y-axis direction. Further, a portion of the signal line 20 lying in the section A3 which includes the via-hole conductors B3, B4 is positioned on the negative side in the y-axis direction relative to portion of the signal line 20 lying in the section A1 which does not include the via-hole conductors B3, B4. Thus, the signal line 20 makes a detour around the via-hole conductors B3, B4 when viewed in plan in the z-axis direction. Thus, the via-hole conductors B3, B4 are located closer to the center line L.

The via-hole conductors B1, B2 and the via-hole conductors B3, B4 are provided at different positions in terms of the x-axis direction. Thus, the via-hole conductors B1, B2, the signal line 20, and the via-hole conductors B3, B4 are not arranged in a row in the y-axis direction. Therefore, a side portion of the line portion 12a on the positive side in the y-axis direction is located closer to the center line L, while the other side portion of the line portion 12a on the negative side in the y-axis direction is located closer to the center line L. As a result, the width in the y-axis direction of the dielectric element assembly 12 is significantly reduced.

According to the high-frequency signal transmission line 10, the thickness is significantly reduced. More specifically, in the high-frequency signal transmission line 10, the auxiliary ground conductor 24 includes the openings 30, 32 and the cutout portions C1, C2. Thus, capacitance is unlikely to be generated between the signal line 20 and the auxiliary ground conductor 24. Therefore, even when the distance in the z-axis direction between the signal line 20 and the auxiliary ground conductor 24 is reduced, the capacitance generated between the signal line 20 and the auxiliary ground conductor 24 is not excessively large. Thus, the characteristic impedance of the signal line 20 is unlikely to deviate from a predetermined characteristic impedance (e.g., about 50Ω). As a result, according to the high-frequency signal transmission line 10, the thickness is significantly reduced while the characteristic impedance of the signal line 20 is maintained at a predetermined characteristic impedance.

In the high-frequency signal transmission line 10, significant reduction of the insertion loss is achieved. More specifically, the auxiliary ground conductor 24 includes the openings 30, 32 and the cutout portions C1, C2. Thus, capacitance is unlikely to be generated between portions of the signal line 20 overlapping with the openings 30, 32 and the cutout portions C1, C2 and the auxiliary ground conductor 24. In view of such, the wide line portions 50, 52 of the signal line 20 are arranged so as to overlap with the openings 30, 32 and the cutout portions C1, C2. Thus, the resistance value of the signal line 20 is significantly reduced, and the insertion loss of the high-frequency signal transmission line 10 is significantly reduced.

According to the high-frequency signal transmission line 10, when the high-frequency signal transmission line 10 is adhered to a metallic body such as the battery pack 206, variations in the characteristic impedance of the signal line 20 are prevented. More specifically, the high-frequency signal transmission line 10 is adhered to the battery pack 206 such that the reference ground conductor 22 in a solid form is provided between the signal line 20 and the battery pack 206. With this arrangement, the signal line 20 and the battery pack 206 would not face each other via an opening, so that formation of capacitance between the signal line 20 and the battery pack 206 is prevented. As a result, decrease of the characteristic impedance of the signal line 20 is prevented by adhering the high-frequency signal transmission line 10 to the battery pack 206.

According to the high-frequency signal transmission line 10, the via-hole conductors B1, B2 are provided on the negative side in the y-axis direction relative to the signal line 20. The via-hole conductors B3, B4 are provided on the positive side in the y-axis direction relative to the signal line 20. Thus, occurrence of spurious radiation is prevented at the opposite sides in the y-axis direction of the signal line 20.

Further, even when a metallic body such as the battery pack 206 is provided on the positive or negative side in the y-axis direction of the high-frequency signal transmission line 10, the via-hole conductors B1, B2 or the via-hole conductors B3, B4 are present between the signal line 20 and the battery pack 206. As a result, capacitance is unlikely to be generated between the signal line 20 and the battery pack 206, so that variations in the characteristic impedance of the signal line 20 are prevented.

First Modification

Figure 8:
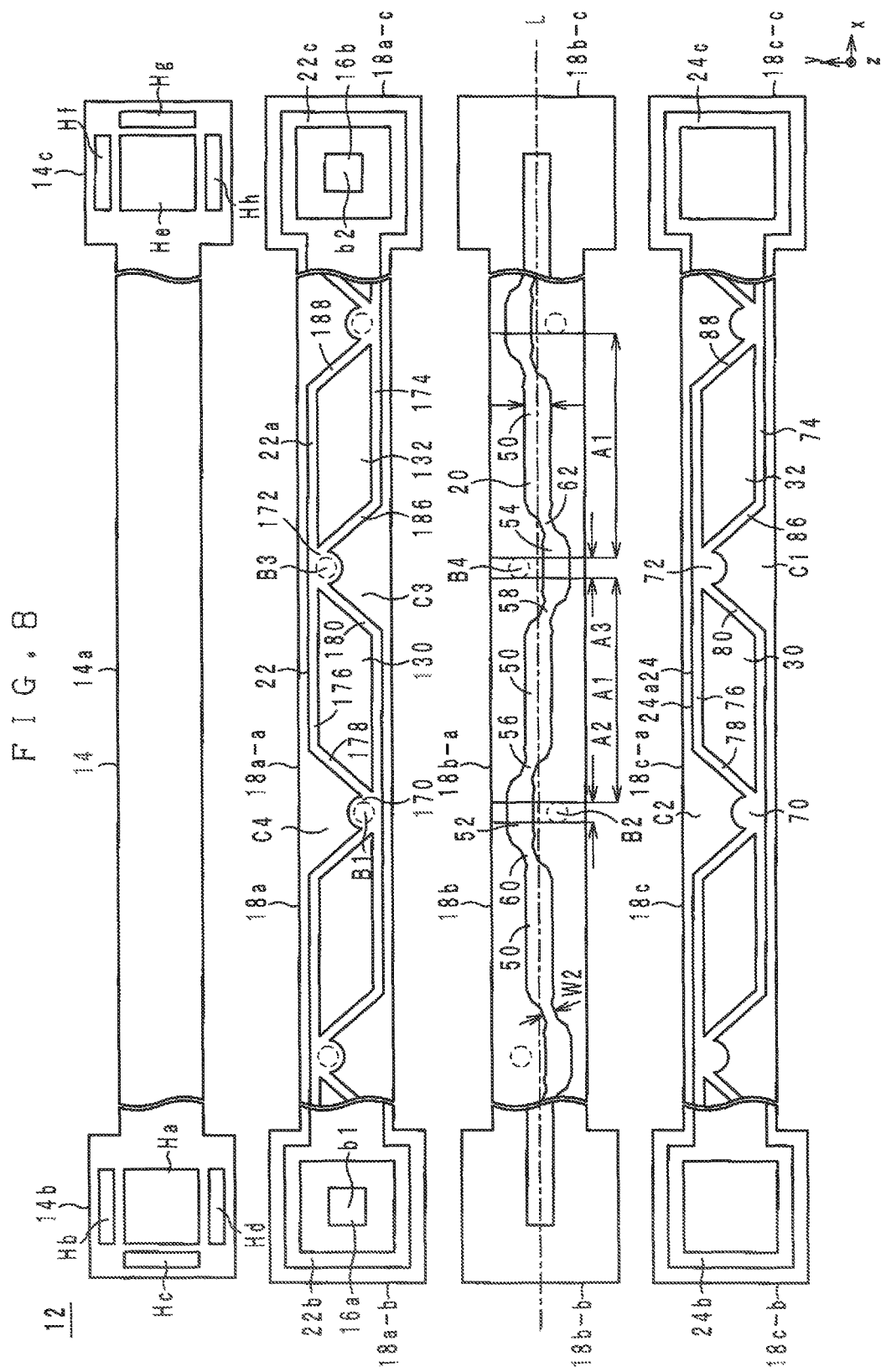
FIG. 8 is an exploded view of a high-frequency signal transmission line according to a first modification of a preferred embodiment of the present invention.

Hereinafter, the configuration of a high-frequency signal transmission line according to a first modification of a preferred embodiment of the present invention is described with reference to the drawings. FIG. 8 is an exploded view of a high-frequency signal transmission line 10a according to the first modification. FIG. 1 is referred to herein for the external perspective view of the high-frequency signal transmission line 10a.

The high-frequency signal transmission line 10a is different from the high-frequency signal transmission line 10 in that the reference ground conductor 22 preferably has the same configuration as the auxiliary ground conductor 24. More specifically, the line portion 22a of the reference ground conductor 22 includes a plurality of openings 130, 132 preferably in the form of a parallelogram elongated in the x-axis direction as shown in FIG. 8. The openings 130, 132 are arranged along the signal line 20.

The line portion 22a includes a plurality of connecting portions 170, 172, side portions 174, 176, and a plurality of bridge portions 178, 180, 186, 188. The side portion 174 is a linear conductor which defines a side portion of the line portion 22a on the negative side in the y-axis direction and which extends in the x-axis direction. The side portion 176 is a linear conductor which defines a side portion of the line portion 22a on the positive side in the y-axis direction and which extends in the x-axis direction. The plurality of connecting portions 170 protrude from the side portion 174 to the positive side in the y-axis direction and preferably has a semicircular or substantially semicircular shape. The plurality of connecting portions 170 are arranged in a row in the x-axis direction with equal intervals. The plurality of connecting portions 172 protrude from the side portion 176 to the negative side in the y-axis direction and preferably has a semicircular or substantially semicircular shape. The plurality of connecting portions 172 are arranged in a row in the x-axis direction with equal or substantially equal intervals. The connecting portions 170 and the connecting portions 172 are provided at different positions in terms of the x-axis direction. In the present preferred embodiment, the connecting portions 170 and the connecting portions 172 are arranged alternately in the x-axis direction. The connecting portion 172 resides at the midpoint in the x-axis direction between two connecting portions 170 which are adjacent to each other in the x-axis direction. The connecting portion 170 resides at the midpoint in the x-axis direction between two connecting portions 172 which are adjacent to each other in the x-axis direction.

The bridge portion 178 is a linear conductor obliquely extending toward the positive side in the x-axis direction while extending from the connecting portion 170 toward the positive side in the y-axis direction. The bridge portion 178 is connected to the side portion 176. The bridge portion 180 is a linear conductor obliquely extending toward the negative side in the x-axis direction while extending from the connecting portion 172 toward the negative side in the y-axis direction. The bridge portion 180 is connected to the side portion 176. The bridge portion 178 and the bridge portion 180 are parallel or substantially parallel to each other. Thus, the opening 130 is preferably provided in a region enclosed by the side portions 174, 176 and the bridge portions 178, 180. The opening 130 identically overlaps with the opening 30 when viewed in plan in the z-axis direction.

The bridge portion 186 is a linear conductor obliquely extending toward the positive side in the x-axis direction while extending from the connecting portion 172 toward the negative side in the y-axis direction. The bridge portion 186 is connected to the side portion 174. The bridge portion 188 is a linear conductor obliquely extending toward the negative side in the x-axis direction while extending from the connecting portion 170 toward the positive side in the y-axis direction. The bridge portion 188 is connected to the side portion 176. The bridge portion 186 and the bridge portion 188 are parallel or substantially parallel to each other. Thus, the opening 132 is preferably provided in a region enclosed by the side portions 174, 176 and the bridge portion 186, 188. The opening 132 overlaps with the opening 32, preferably exactly or entirely, when viewed in plan in the z-axis direction.

The side portion 174 of the line portion 22a includes a cutout portion C3. The cutout portion C3 is provided in the line portion 22a, at a position on the negative side in the y-axis direction relative to the connecting portion 172. Thus, at the cutout portion C3, the side portion 174 is separated.

The side portion 176 of the line portion 22a includes a cutout portion C4. The cutout portion C4 is provided in the line portion 22a, at a position on the positive side in the y-axis direction relative to the connecting portion 170. Thus, at the cutout portion C4, the side portion 176 is separated.

According to the high-frequency signal transmission line 10a that has the above-described configuration, the width in the y-axis direction of the dielectric element assembly 12 is significantly reduced as in the high-frequency signal transmission line 10.

Further, according to the high-frequency signal transmission line 10a, the thickness is further significantly reduced. More specifically, in the high-frequency signal transmission line 10a, the reference ground conductor 22 also includes openings 130, 132 and cutout portions C3, C4. Thus, capacitance is unlikely to be generated between the signal line 20 and the reference ground conductor 22. Therefore, even when the distance in the z-axis direction between the signal line 20 and the reference ground conductor 22 is reduced, the capacitance generated between the signal line 20 and the reference ground conductor 22 is not excessively large. Thus, the characteristic impedance of the signal line 20 is unlikely to deviate from a predetermined characteristic impedance (e.g., about 50Ω). As a result, according to the high-frequency signal transmission line 10a, the thickness is significantly reduced while the characteristic impedance of the signal line 20 is maintained at a predetermined characteristic impedance.

In the high-frequency signal transmission line 10a, significant reduction of the insertion loss is achieved as in the high-frequency signal transmission line 10.

According to the high-frequency signal transmission line 10a, variations in the characteristic impedance of the signal line 20 are prevented as in the high-frequency signal transmission line 10.

Second Modification

Figure 9:
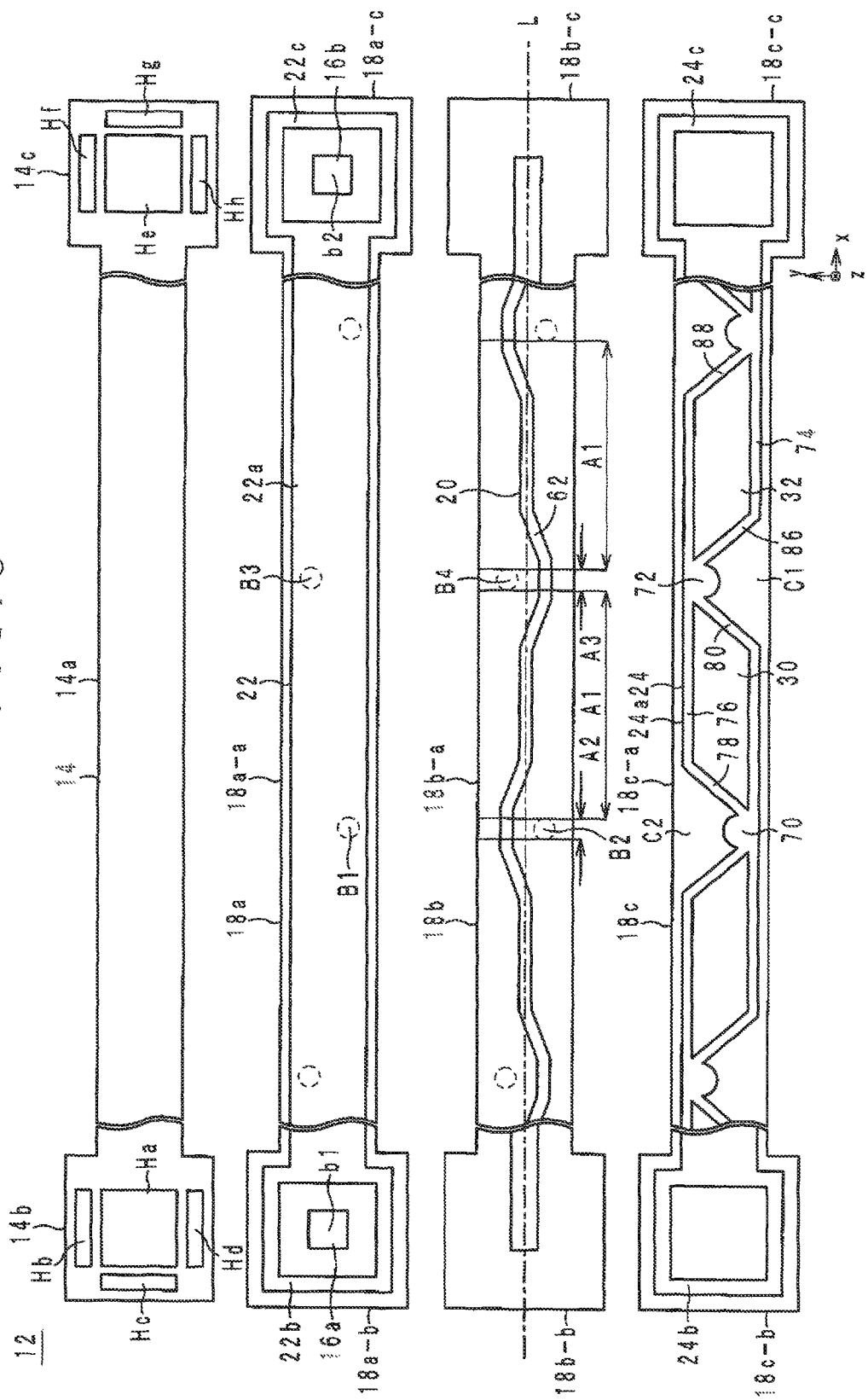
FIG. 9 is an exploded view of a high-frequency signal transmission line according to a second modification of a preferred embodiment of the present invention.

Hereinafter, the configuration of a high-frequency signal transmission line according to a second modification of a preferred embodiment of the present invention is described with reference to the drawings. FIG. 9 is an exploded view of a high-frequency signal transmission line 10b according to the second modification. FIG. 1 is referred to herein for the external perspective view of the high-frequency signal transmission line 10b.

The high-frequency signal transmission line 10b is different from the high-frequency signal transmission line 10 in the configuration of the signal line 20. More specifically, in the high-frequency signal transmission line 10b, the width of the signal line 20 preferably is uniform.

According to the high-frequency signal transmission line 10b that has the above-described configuration, the width in the y-axis direction of the dielectric element assembly 12 is significantly reduced as in the high-frequency signal transmission line 10.

According to the high-frequency signal transmission line 10b, the thickness is further significantly reduced as in the high-frequency signal transmission line 10.

According to the high-frequency signal transmission line 10b, variations in the characteristic impedance of the signal line 20 is prevented as in the high-frequency signal transmission line 10.

Third Modification

Figure 10:
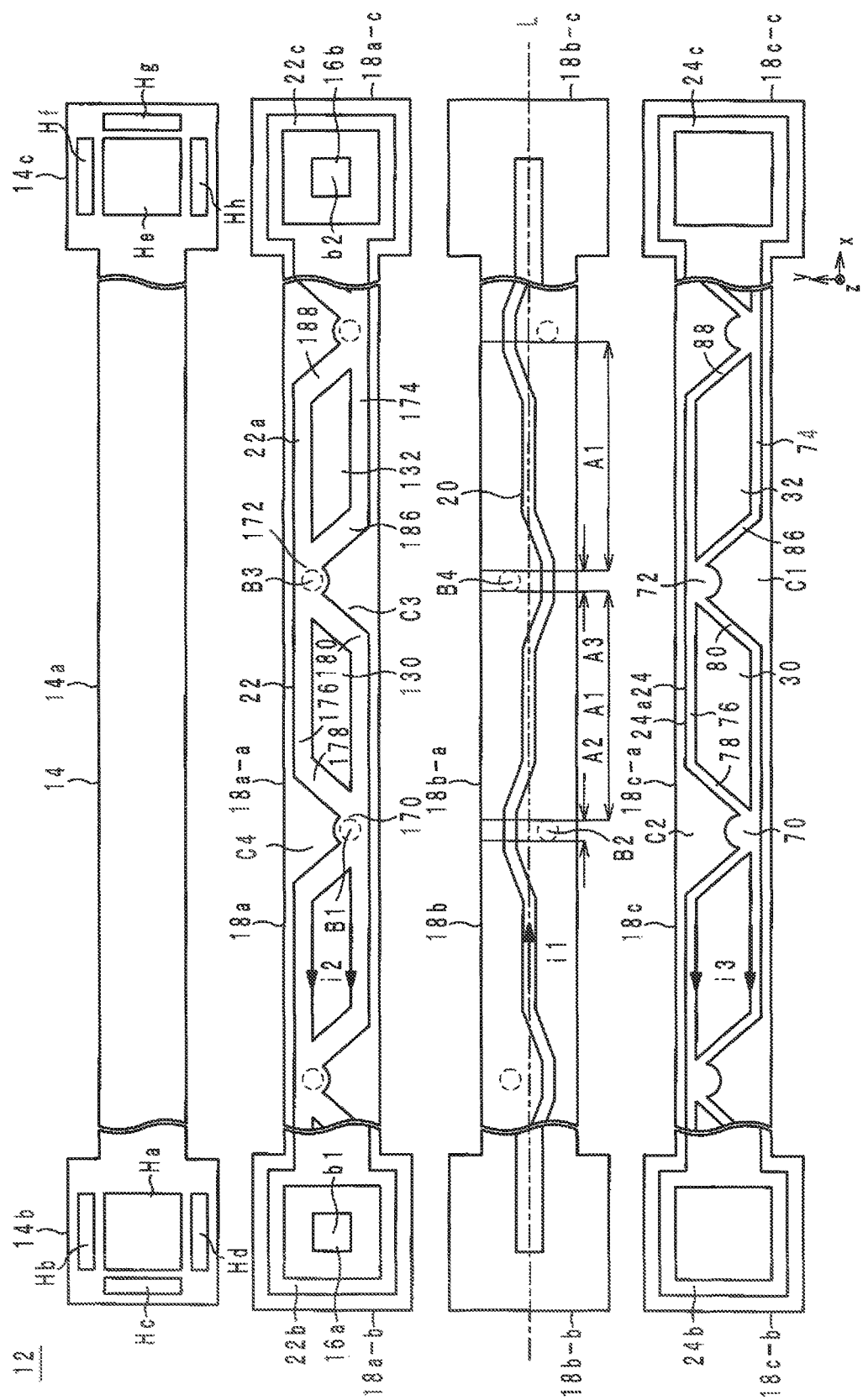
FIG. 10 is an exploded view of a high-frequency signal transmission line according to a third modification of a preferred embodiment of the present invention.

Hereinafter, the configuration of a high-frequency signal transmission line according to a third modification of a preferred embodiment of the present invention is described with reference to the drawings. FIG. 10 is an exploded view of a high-frequency signal transmission line 10c according to the third modification. FIG. 1 is referred to herein for the external perspective view of the high-frequency signal transmission line 10c.

The high-frequency signal transmission line 10c is different from the high-frequency signal transmission line 10a in the size of the openings 130, 132. More specifically, the size of the opening 130 is smaller than the size of the opening 30. The opening 130 preferably has a similar shape to that of the opening 30 and lies within the extent of the opening 30 when viewed in plan in the z-axis direction. The size of the opening 132 is smaller than the size of the opening 32. The opening 132 preferably has a similar shape to that of the opening 32 and lies within the extent of the opening 32 when viewed in plan in the z-axis direction.

According to the high-frequency signal transmission line 10c that has the above-described configuration, the width in the y-axis direction of the dielectric element assembly 12 is significantly reduced as in the high-frequency signal transmission line 10a.

According to the high-frequency signal transmission line 10c, the thickness is further significantly reduced as in the high-frequency signal transmission line 10a.

According to the high-frequency signal transmission line 10c, reduction of the insertion loss is achieved for the following reasons. In the high-frequency signal transmission line 10c, when an electric current i1 flows through the signal line 20, a feedback current (reverse current) i2 flows through the reference ground conductor 22, and a feedback current (reverse current) i3 flows through the auxiliary ground conductor 24. In the high-frequency signal transmission line 10c, the perimeter of the opening 30 and the perimeter of the opening 130 do not overlap with each other. Also, the perimeter of the opening 32 and the perimeter of the opening 132 do not overlap with each other. Thus, the position at which the feedback current i2 flows and the position at which the feedback current i3 flows are distant from each other. As a result, the coupling strength of the feedback current i2 and the feedback current i3 is significantly reduced, so that the electric current i1 flows more smoothly. Therefore, reduction of the insertion loss of the high-frequency signal transmission line 10c is achieved.

According to the high-frequency signal transmission line 10c, variations in the characteristic impedance of the signal line 20 are prevented as in the high-frequency signal transmission line 10a.

Fourth Modification

Figure 11:
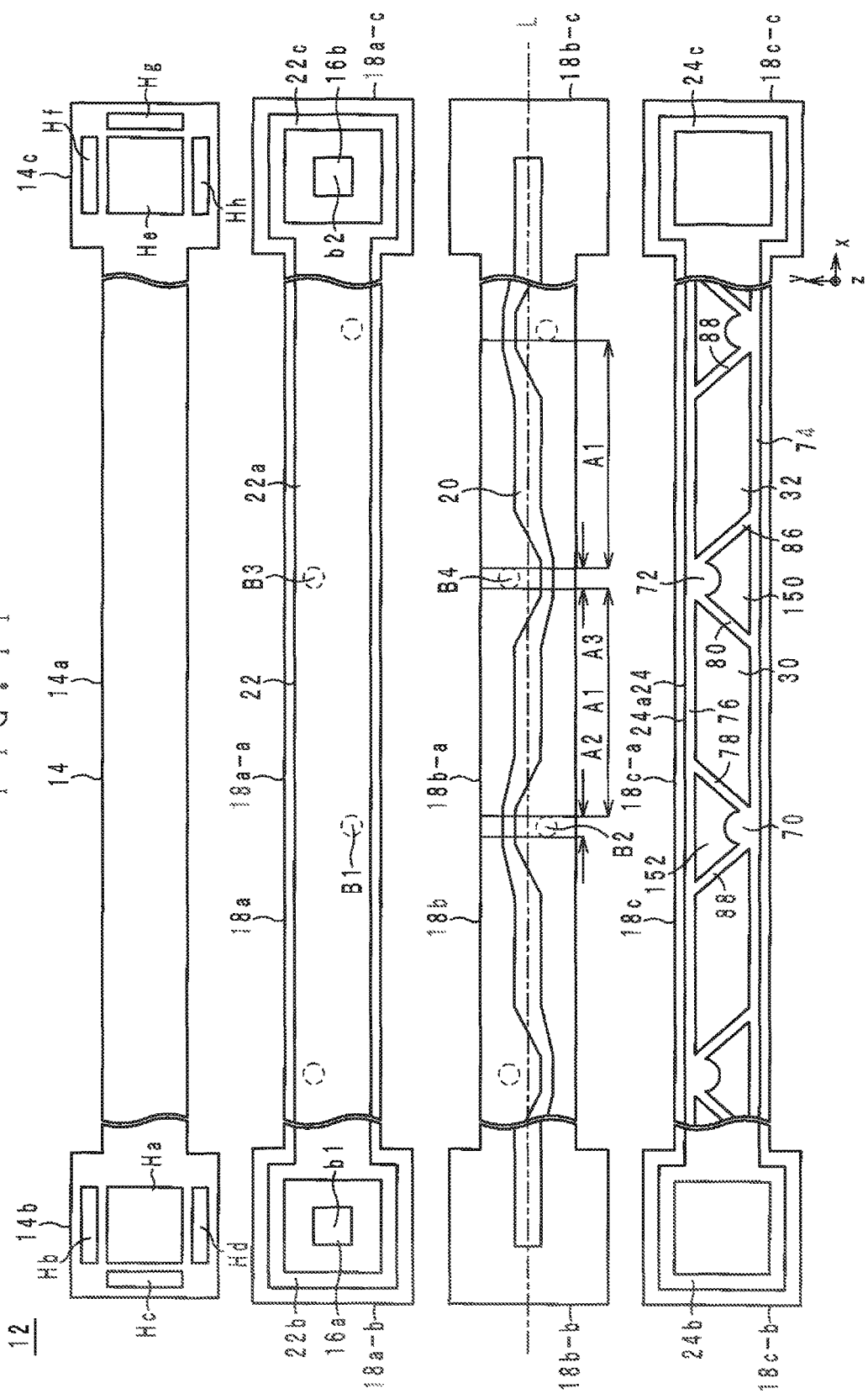
FIG. 11 is an exploded view of a high-frequency signal transmission line according to a fourth modification of a preferred embodiment of the present invention.

Hereinafter, the configuration of a high-frequency signal transmission line according to a fourth modification of a preferred embodiment of the present invention is described with reference to the drawings. FIG. 11 is an exploded view of a high-frequency signal transmission line 10d according to the fourth modification. FIG. 1 is referred to herein for the external perspective view of the high-frequency signal transmission line 10d.

The high-frequency signal transmission line 10d is different from the high-frequency signal transmission line 10 in the configuration of the auxiliary ground conductor 24 and the configuration of the signal line 20. More specifically, the auxiliary ground conductor 24 of the high-frequency signal transmission line 10d does not include the cutout portions C1, C2. That is, the side portions 74, 76 are not severed but defined by a single linear conductor. Therefore, there is an opening 150 surrounded by the side portion 74 and the bridge portions 80, 86. Also, there is an opening 152 surrounded by the side portion 76 and the bridge portions 78, 88.

Portions of the signal line 20 overlapping with the openings 150, 152 preferably have a smaller width than portions of the signal line 20 overlapping with the openings 30, 32. This is for the purpose of avoiding overlap of the signal line 20 and the side portions 74, 76 in the sections A2, A3.

According to the high-frequency signal transmission line 10d that has the above-described configuration, the width in the y-axis direction of the dielectric element assembly 12 is significantly reduced as in the high-frequency signal transmission line 10.

According to the high-frequency signal transmission line 10d, the thickness is further significantly reduced as in the high-frequency signal transmission line 10.

In the high-frequency signal transmission line 10d, reduction of the insertion loss is achieved as in the high-frequency signal transmission line 10.

According to the high-frequency signal transmission line 10d, variations in the characteristic impedance of the signal line 20 are prevented as in the high-frequency signal transmission line 10.

According to the high-frequency signal transmission line 10d, the side portions 74, 76 do not include the cutout portions C1, C2. Thus, occurrence of spurious radiation from the signal line 20 is prevented.

Fifth Modification

Figure 12:
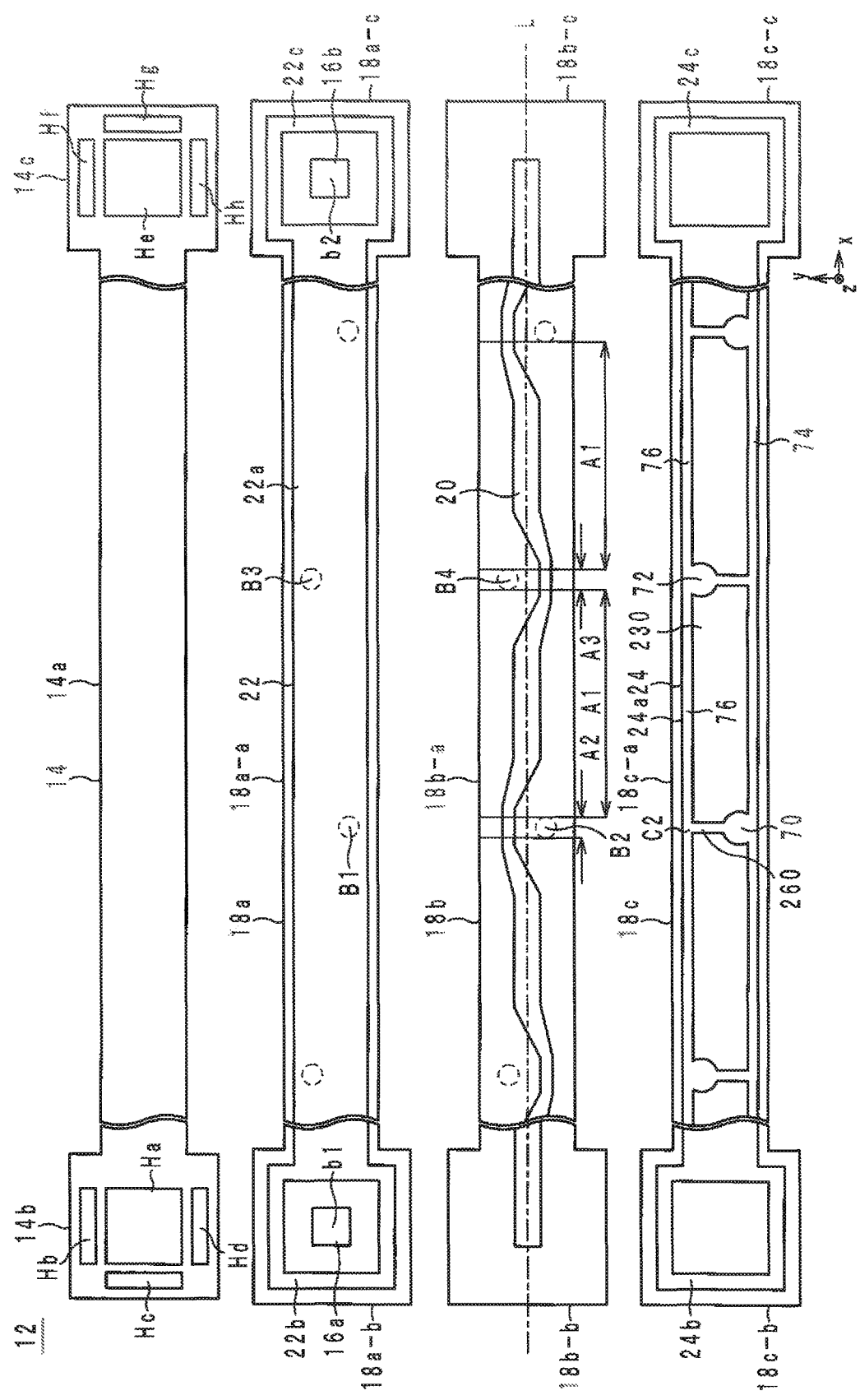
FIG. 12 is an exploded view of a high-frequency signal transmission line according to a fifth modification of a preferred embodiment of the present invention.

Hereinafter, the configuration of a high-frequency signal transmission line according to a fifth modification of a preferred embodiment of the present invention is described with reference to the drawings. FIG. 12 is an exploded view of a high-frequency signal transmission line 10e according to the fifth modification. FIG. 1 is referred to herein for the external perspective view of the high-frequency signal transmission line 10e.

The high-frequency signal transmission line 10e is different from the high-frequency signal transmission line 10d in the configuration of the auxiliary ground conductor 24. In the high-frequency signal transmission line 10e, the line portion 24a of the auxiliary ground conductor 24 preferably includes rectangular or substantially rectangular openings 230 which are elongated in the x-axis direction. The openings 230 are arranged along the signal line 20. In the following section, a portion of the auxiliary ground conductor 24 lying between adjacent openings 230 is referred to as "bridge portion 260". The bridge portion 260 is a linear conductor extending in the y-axis direction so as to connect the side portions 74, 76. Thus, the auxiliary ground conductor 24 preferably has a ladder-shaped configuration.

Portions of the signal line 20 overlapping with the bridge portions 260 have a smaller width than portions of the signal line 20 overlapping with openings 230.

According to the high-frequency signal transmission line 10e that has the above-described configuration, the width in the y-axis direction of the dielectric element assembly 12 is significantly reduced as in the high-frequency signal transmission line 10d.

According to the high-frequency signal transmission line 10e, the thickness is further significantly reduced as in the high-frequency signal transmission line 10d.

In the high-frequency signal transmission line 10e, reduction of the insertion loss is achieved as in the high-frequency signal transmission line 10d.

According to the high-frequency signal transmission line 10e, variations in the characteristic impedance of the signal line 20 are prevented as in the high-frequency signal transmission line 10d.

According to the high-frequency signal transmission line 10e, the side portions 74, 76 do not include the cutout portions C1, C2. Thus, occurrence of spurious radiation from the signal line 20 is prevented.

Sixth Modification

Figure 13:
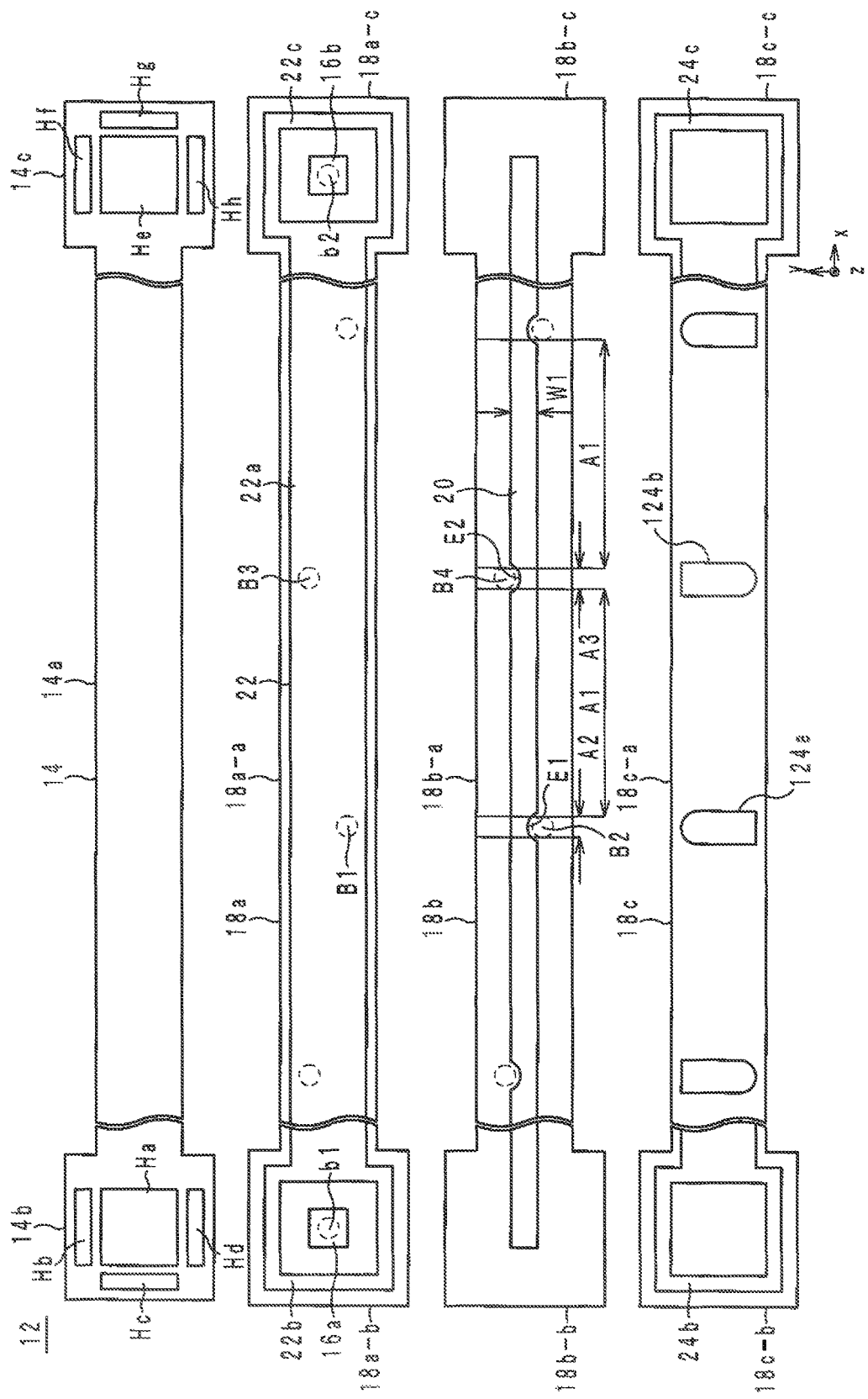
FIG. 13 is an exploded view of a high-frequency signal transmission line according to a sixth modification of a preferred embodiment of the present invention.
Figure 14:
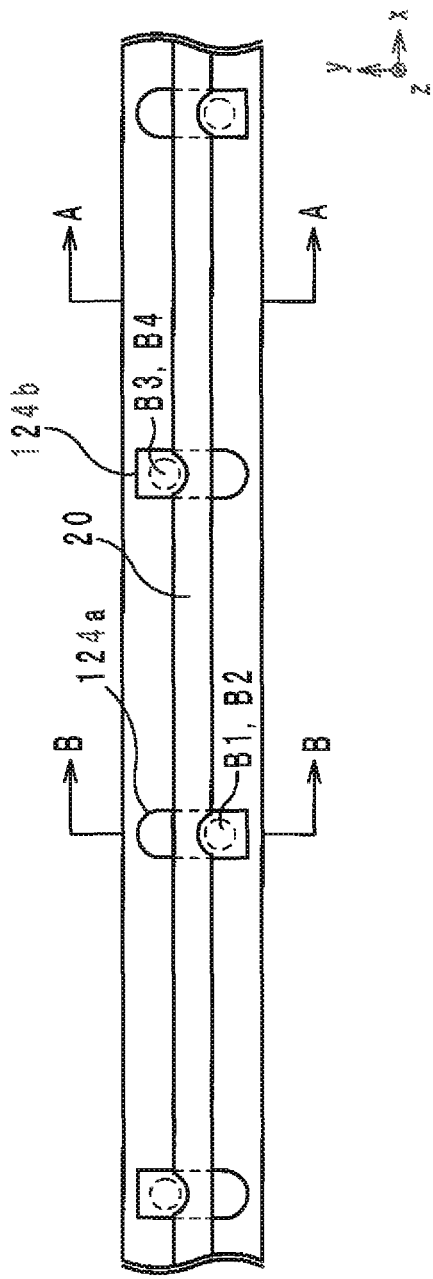
FIG. 14 is a see-through view of the high-frequency signal transmission line according to the sixth modification in which a signal line and line portions are shown.

Hereinafter, the configuration of a high-frequency signal transmission line according to a sixth modification of a preferred embodiment of the present invention is described with reference to the drawings. FIG. 13 is an exploded view of a high-frequency signal transmission line 10f according to the sixth modification. FIG. 14 is a see-through view of the high-frequency signal transmission line 10f of the sixth modification in which the signal line 20 and line portions 124a, 124b are shown. FIG. 15 is a cross-sectional structure view taken along line A-A of FIG. 14. FIG. 16 is a cross-sectional structure view taken along line B-B of FIG. 14. FIG. 1 is referred to herein for the external perspective view of the high-frequency signal transmission line 10f.

The high-frequency signal transmission line 10f is different from the high-frequency signal transmission line 10 in that the signal line 20 has a different shape and that the line portions 124a, 124b are provided in place of the line portion 24a. The following description of the high-frequency signal transmission line 10f is mainly focused on these differences.

The width of the signal line 20 of the high-frequency signal transmission line 10f is greater than the width of the high-frequency signal transmission line 10. Note that, however, the signal line 20 of the high-frequency signal transmission line 10f does not meander as the signal line 20 of the high-frequency signal transmission line 10 does. Thus, in the high-frequency signal transmission line 10f, the signal line 20 includes cutout portions E1, E2 such that the signal line 20 is not in contact with the via-hole conductors B2, B4.

The cutout portion E1 is arranged in the section A2 so that a side portion of the signal line 20 on the negative side in the y-axis direction is recessed toward the positive side in the y-axis direction so as to define an arc. Thus, a portion of the signal line 20 lying in the section A2 is positioned on the positive side in the y-axis direction relative to portion of the signal line 20 lying in the section A1.

The cutout portion E2 is arranged in the section A3 so that a side portion of the signal line 20 on the positive side in the y-axis direction is recessed toward the negative side in the y-axis direction so as to define an arc. Thus, portion of the signal line 20 lying in the section A3 is positioned on the negative side in the y-axis direction relative to portion of the signal line 20 lying in the section A1.

The line portion 124a is a band-shaped conductor provided on the top surface of the dielectric sheet 18c and extending in the y-axis direction in the section A2. The line portion 124a overlaps with the signal line 20 when viewed in plan in the z-axis direction and is connected to the reference ground conductor 22 via the via-hole conductors B1, B2.

The line portion 124b is a band-shaped conductor provided on the top surface of the dielectric sheet 18c and extending in the y-axis direction in the section A3. The line portion 124b overlaps with the signal line 20 when viewed in plan in the z-axis direction and is connected to the reference ground conductor 22 via the via-hole conductors B3, B4.

According to the high-frequency signal transmission line 10f that has the above-described configuration, the width in the y-axis direction of the dielectric element assembly 12 is significantly reduced as in the high-frequency signal transmission line 10.

According to the high-frequency signal transmission line 10f, the thickness is further significantly reduced as in the high-frequency signal transmission line 10.

In the high-frequency signal transmission line 10f, significant reduction of the insertion loss is achieved as in the high-frequency signal transmission line 10.

According to the high-frequency signal transmission line 10f, variations in the characteristic impedance of the signal line 20 are prevented as in the high-frequency signal transmission line 10.

The area of the line portions 124a, 124b of the high-frequency signal transmission line 10f is smaller than the area of the line portion 24a of the high-frequency signal transmission line 10. Therefore, the high-frequency signal transmission line 10f is bendable more readily than the high-frequency signal line 10.

Seventh Modification

Figure 17:
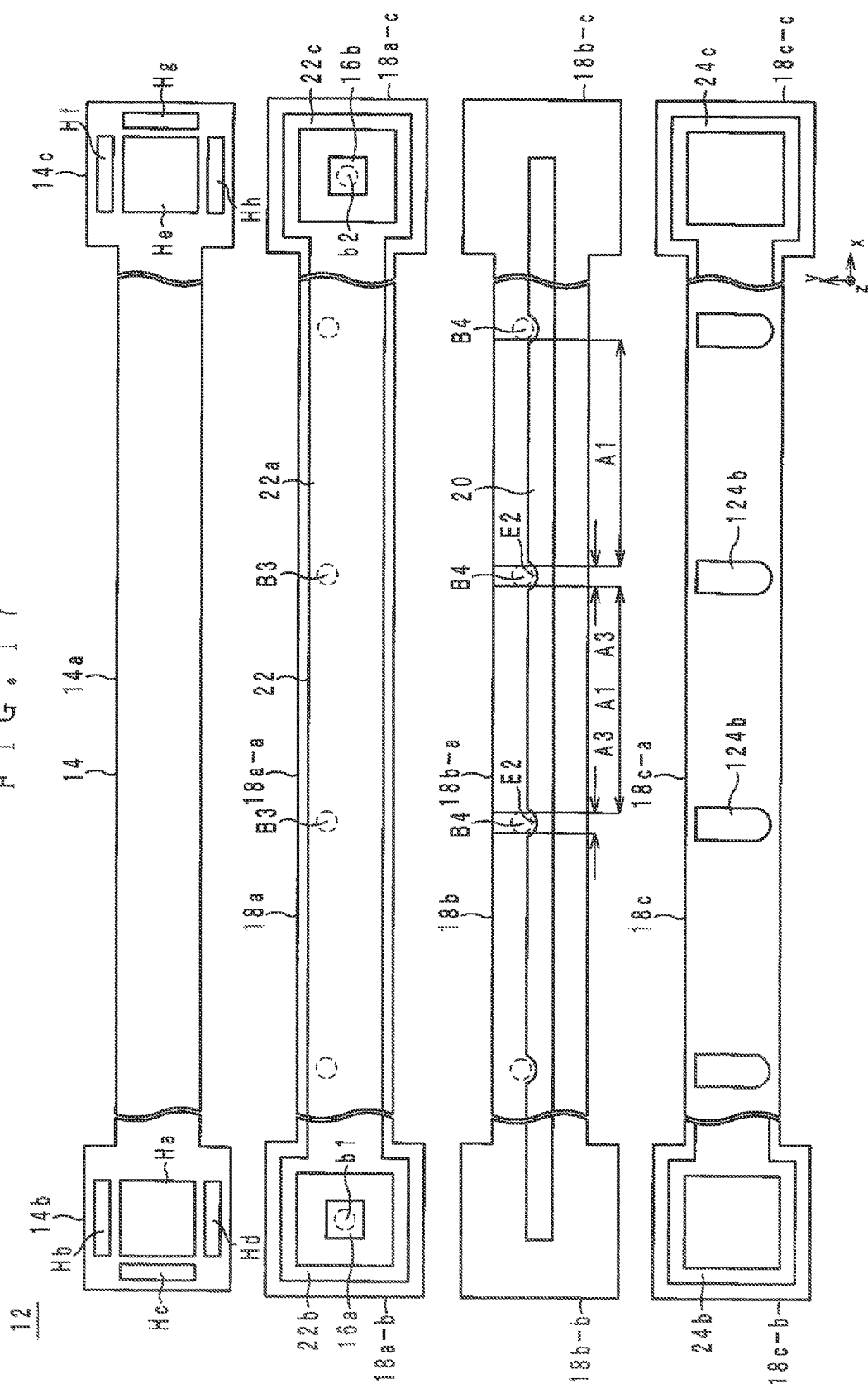
FIG. 17 is an exploded view of a high-frequency signal transmission line according to a seventh modification of a preferred embodiment of the present invention.

Hereinafter, the configuration of a high-frequency signal transmission line according to a seventh modification of a preferred embodiment of the present invention is described with reference to the drawings. FIG. 17 is an exploded view of a high-frequency signal transmission line 10g according to the seventh modification. FIG. 1 is referred to herein for the external perspective view of the high-frequency signal transmission line 10g.

The high-frequency signal transmission line 10g is different from the high-frequency signal transmission line 10f in that the section A3 is provided at the position of the section A2. The following description of the high-frequency signal transmission line 10g is mainly focused on this difference.

In the high-frequency signal transmission line 10g, the sections A1 and the sections A3 are alternately arranged in the x-axis direction. Therefore, the via-hole conductors B3, B4 are provided on the positive side in the y-axis direction of the signal line 20 while no via-hole conductor is provided on the negative side in the y-axis direction of the signal line 20. Further, in the section A3, a side portion of the signal line 20 on the positive side in the y-axis direction has a cutout portion E2. Note that, however, since the section A2 is not present, the cutout portion E1 is not provided in the signal line 20.

The high-frequency signal transmission line 10g preferably includes a line portion 124b but does not have a line portion 124a.

According to the high-frequency signal transmission line 10g that has the above-described configuration, the width in the y-axis direction of the dielectric element assembly 12 is significantly reduced as in the high-frequency signal transmission line 10f.

According to the high-frequency signal transmission line 10g, the thickness is further significantly reduced as in the high-frequency signal transmission line 10f.

In the high-frequency signal transmission line 10g, significant reduction of the insertion loss is achieved as in the high-frequency signal transmission line 10f.

According to the high-frequency signal transmission line 10g, variations in the characteristic impedance of the signal line 20 are prevented as in the high-frequency signal transmission line 10f.

The area of the line portion 124b of the high-frequency signal transmission line 10g is smaller than the area of the line portion 24a of the high-frequency signal transmission line 10. Therefore, the high-frequency signal transmission line 10g is bendable more readily than the high-frequency signal line 10.

In the high-frequency signal transmission line 10g, the via-hole conductors B3, B4 are provided instead of the via-hole conductors B1, B2. This arrangement more effectively prevents radiation of noise from the positive side in the y-axis direction of the high-frequency signal transmission line 10g. In the high-frequency signal transmission line 10g that has such a configuration, radiation of noise from the negative side in the y-axis direction would not constitute a significant problem. Therefore, the high-frequency signal transmission line 10g is suitably applicable to an electronic device in which radiation of noise from the positive side in the y-axis direction constitutes a significant problem.

Eighth Modification

Figure 18:
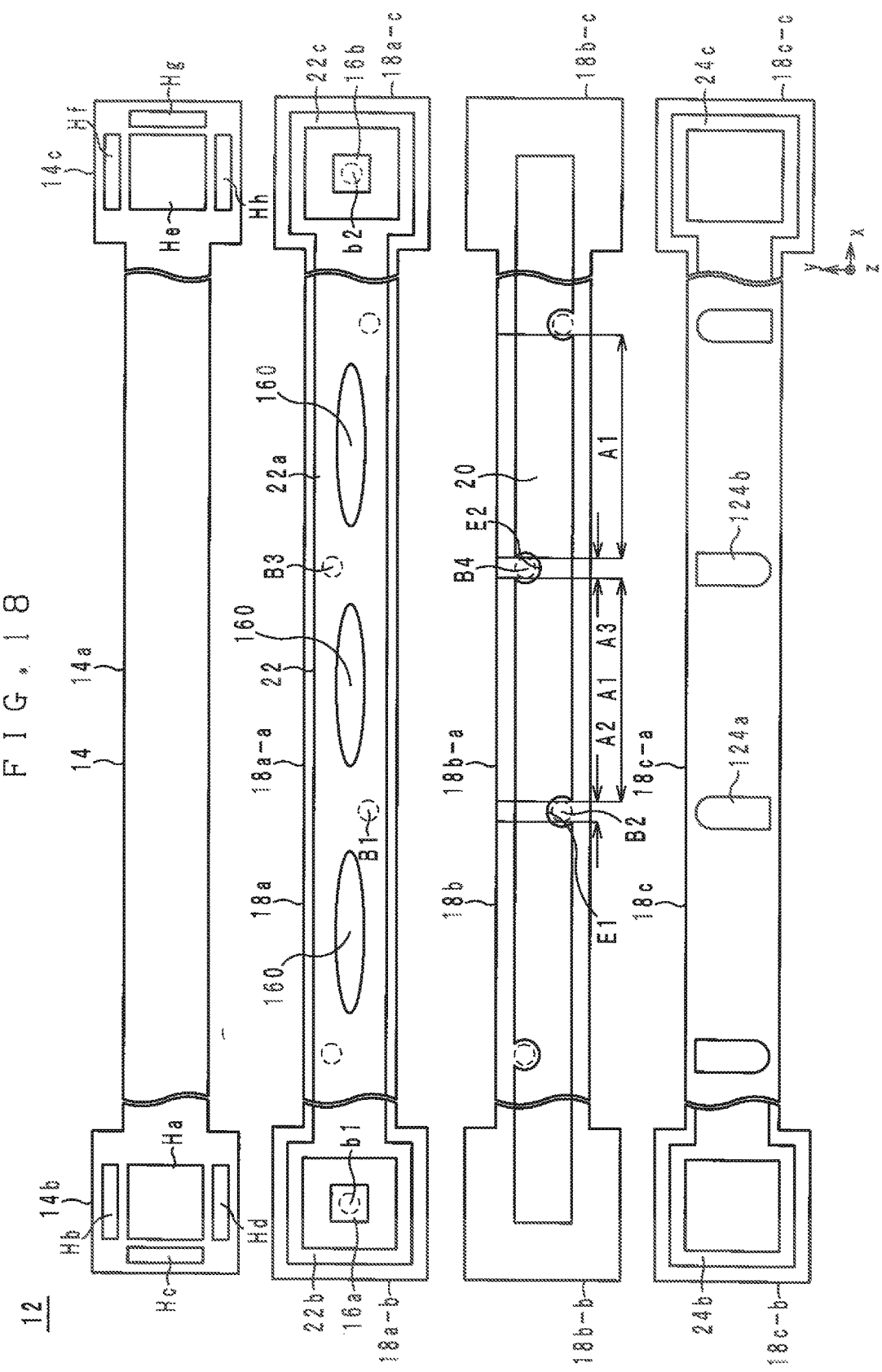
FIG. 18 is an exploded view of a high-frequency signal transmission line according to an eighth modification of a preferred embodiment of the present invention.

Hereinafter, the configuration of a high-frequency signal transmission line according to an eighth modification of a preferred embodiment of the present invention is described with reference to the drawings. FIG. 18 is an exploded view of a high-frequency signal transmission line 10h according to the eighth modification. FIG. 1 is referred to herein for the external perspective view of the high-frequency signal transmission line 10h.

The high-frequency signal transmission line 10h is different from the high-frequency signal transmission line 10f in that the width of the signal line 20 is different and that the reference ground conductor 22 includes openings 160. The following description of the high-frequency signal transmission line 10h is mainly focused on these differences.

The width of the signal line 20 of the high-frequency signal transmission line 10h is greater than the width of the signal line 20 of the high-frequency signal transmission line 10f. Therefore, the cutout portions E1, E2 of the high-frequency signal transmission line 10h are greater than the cutout portions E1, E2 of the high-frequency signal transmission line 10f.

The openings 160 are provided in the reference ground conductor 22. In the section A1, the openings 160 are provided in the reference ground conductor 22 so as to overlap with the signal line 20 when viewed in plan in the z-axis direction. The openings 160 preferably have an elliptical or substantially elliptical shape whose major axis extends in the x-axis direction.

According to the high-frequency signal transmission line 10h that has the above-described configuration, the width in the y-axis direction of the dielectric element assembly 12 is significantly reduced as in the high-frequency signal transmission line 10f.

According to the high-frequency signal transmission line 10h, the thickness is further significantly reduced as in the high-frequency signal transmission line 10f.

In the high-frequency signal transmission line 10h, significant reduction of the insertion loss is achieved as in the high-frequency signal transmission line 10f.

According to the high-frequency signal transmission line 10h, variations in the characteristic impedance of the signal line 20 are prevented as in the high-frequency signal transmission line 10f.

The area of the line portions 124a, 124b of the high-frequency signal transmission line 10h is smaller than the area of the line portion 24a of the high-frequency signal transmission line 10. Therefore, the high-frequency signal transmission line 10h is bendable more readily than the high-frequency signal line 10.

According to the high-frequency signal transmission line 10h, the signal line 20 has a wide width so that the direct current resistance value of the signal line 20 decreases.

According to the high-frequency signal transmission line 10h, the cutout portions E1, E2 are large because the signal line 20 has a wide width. Therefore, the difference between the width of the signal line 20 in the sections A2, A3 and the width of the signal line 20 in the sections A1 is excessively large. As a result, there is a large difference between the capacitance generated between the signal line 20 and the reference ground conductor 22 and the line portions 124a, 124b in the sections A2, A3 and the capacitance generated between the signal line 20 and the reference ground conductor 22 in the sections A1. In view of such, in the sections A1, the reference ground conductor 22 includes the openings 160. This arrangement prevents the capacitance generated between the signal line 20 and the reference ground conductor 22 in the sections A1 from becoming excessively large. Thus, adjustment of the characteristic impedance of the high-frequency signal transmission line 10h is achieved more readily.

Ninth Modification

Hereinafter, the configuration of a high-frequency signal transmission line according to a ninth modification according to a preferred embodiment of the present invention is described with reference to the drawings. FIG. 19 is an exploded view of a high-frequency signal transmission line 10i according to the ninth modification. FIG. 1 is referred to herein for the external perspective view of the high-frequency signal transmission line 10i.

The high-frequency signal transmission line 10i is different from the high-frequency signal transmission line 10h in that the width of the signal line 20 is different and that the positions of the openings 160 are different. The following description of the high-frequency signal transmission line 10*i* is mainly focused on these differences.

The width of the signal line 20 of the high-frequency signal transmission line 10*i* is greater than the width of the signal line 20 of the high-frequency signal transmission line 10*h*. Therefore, the cutout portions E1, E2 of the high-frequency signal transmission line 10*i* are smaller than the cutout portions E1, E2 of the high-frequency signal transmission line 10*h*.

The openings 160 are provided in the reference ground conductor 22. In the sections A2, A3, the openings 160 are provided in the reference ground conductor 22 so as to overlap with the signal line 20 when viewed in plan in the z-axis direction. The openings 160 preferably have an elliptical or substantially elliptical shape whose major axis extends in the x-axis direction.

According to the high-frequency signal transmission line 10*i* that has the above-described configuration, the width in the y-axis direction of the dielectric element assembly 12 is significantly reduced as in the high-frequency signal transmission line 10*h*.

According to the high-frequency signal transmission line 10*i*, the thickness is further significantly reduced as in the high-frequency signal transmission line 10*h*.

In the high-frequency signal transmission line 10*i*, significant reduction of the insertion loss is achieved as in the high-frequency signal transmission line 10*h*.

According to the high-frequency signal transmission line 10*i*, variations in the characteristic impedance of the signal line 20 are prevented as in the high-frequency signal transmission line 10*h*.

The area of the line portions 124*a*, 124*b* of the high-frequency signal transmission line 10*i* is smaller than the area of the line portion 24*a* of the high-frequency signal transmission line 10. Therefore, the high-frequency signal transmission line 10*i* is bendable more readily than the high-frequency signal line 10.

According to the high-frequency signal transmission line 10*i*, the cutout portions E1, E2 are small because the signal line 20 has a small width. Therefore, there is a large difference between the capacitance generated between the signal line 20 and the reference ground conductor 22 and the line portions 124*a*, 124*b* in the sections A2, A3 and the capacitance generated between the signal line 20 and the reference ground conductor 22 in the sections A1. In view of such a configuration, in the sections A2, A3, the reference ground conductor 22 includes the openings 160. This arrangement prevents the capacitance generated between the signal line 20 and the reference ground conductor 22 in the sections A2, A3 from becoming excessively large. Thus, adjustment of the characteristic impedance of the high-frequency signal transmission line 10*i* is achieved more readily.

Other Preferred Embodiments

The high-frequency signal transmission line according to the present invention is not limited to the high-frequency signal transmission lines 10, 10*a* to 10*i* of various preferred embodiments and modifications thereof but can be varied within the scope of the spirit of the invention.

Note that the elements or features of the high-frequency signal transmission lines 10, 10*a* to 10*i* may be combined as desired.

The protective layer 14 preferably is formed by screen printing in the above description but may be formed by photolithography or other suitable methods, for example.

In the high-frequency signal transmission lines 10, 10*a* to 10*i*, the connectors 100*a*, 100*b* may not be mounted. In this case, the ends of the high-frequency signal transmission lines 10, 10*a* to 10*i* are preferably connected to the circuit board by soldering, for example. Note that only one end of the high-frequency signal transmission lines 10, 10*a* to 10*i* may be provided with the connector 100*a* mounted thereon, for example.

Note that through-hole conductors may be used instead of the via-hole conductors. The through-hole conductors are interlayer connecting portions which are realized preferably by forming a conductor by plating on the inner perimeter surface of through holes provided in the dielectric element assembly 12.

Note that only either one of the via-hole conductors B1, B2 and connecting portions 70 and the via-hole conductors B3, B4 and connecting portions 72 may be provided. Specifically, the via-hole conductors B1, B2 may be arranged at positions on the negative side in the y-axis direction of the high-frequency signal transmission lines 10, 10*a* to 10*e*. Alternatively, the via-hole conductors B3, B4 may be arranged at positions on the positive side in the y-axis direction of the high-frequency signal transmission lines 10, 10*a* to 10*e*. Note that, however, to prevent spurious radiation, it is preferred that both of the via-hole conductors B1, B2 and connecting portions 70 and the via-hole conductors B3, B4 and connecting portions 72 are provided, for example.

Note that the high-frequency signal transmission lines 10, 10*a* to 10*i* may preferably be used as a high-frequency signal line in an RF circuit board, such as an antenna front end module, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
   a dielectric element assembly including a plurality of dielectric layers stacked on each other in a direction of lamination and extending in a predetermined direction;
   a signal line provided in the dielectric element assembly and extending in the predetermined direction;
   a first ground conductor provided on one side in the direction of lamination relative to the signal line;
   a second ground conductor provided on the other side in the direction of lamination relative to the signal line; and
   a first interlayer connecting conductor connecting together the first ground conductor and the second ground conductor, the first interlayer connecting conductor being provided in the dielectric element assembly on one side relative to a center in a width direction of the dielectric element assembly, the width direction being perpendicular or substantially perpendicular to the predetermined direction and to the direction of lamination; wherein
   the dielectric element assembly includes a first region in which the first interlayer connecting conductor is provided and in which no interlayer connecting conductors are provided on the other side relative to the center in the width direction, and a second region in which no interlayer connecting conductors are provided;

in the first region, a portion of the signal line in a section that includes the first interlayer connecting conductor is positioned on the other side in the width direction relative to the center in the width direction of the dielectric element assembly; and in the second region, the signal line includes a portion that is positioned to overlap with the center in the width direction of the dielectric element assembly.

2. The high-frequency signal transmission line according to claim 1, wherein
the first ground conductor and the second ground conductor overlap with the signal line when viewed in plan in the direction of lamination.

3. The high-frequency signal transmission line according to claim 1, wherein
the second ground conductor includes a plurality of second openings arranged along the signal line.

4. The high-frequency signal transmission line according to claim 3, wherein
a distance in the direction of lamination between the signal line and the second ground conductor is smaller than a distance in the direction of lamination between the signal line and the first ground conductor.

5. The high-frequency signal transmission line according to claim 3, wherein
the first ground conductor includes a plurality of first openings arranged along the signal line, the plurality of first openings being smaller than the plurality of second openings.

6. The high-frequency signal transmission line according to claim 1, wherein
the high-frequency signal transmission line includes:
a plurality of the first interlayer connecting conductors; and
a plurality of the first region; and
the plurality of first interlayer connecting conductors in the plurality of first regions are arranged at uniform intervals.

7. An electronic device comprising:
a high-frequency signal transmission line; and
a housing enclosing the high-frequency signal transmission line; wherein
the high-frequency signal transmission line includes:
a dielectric element assembly including a plurality of dielectric layers stacked on each other in a direction of lamination and extending in a predetermined direction;
a signal line provided in the dielectric element assembly and extending in the predetermined direction;
a first ground conductor provided on one side in the direction of lamination relative to the signal line;
a second ground conductor provided on the other side in the direction of lamination relative to the signal line; and
a first interlayer connecting conductor connecting together the first ground conductor and the second ground conductor, the first interlayer connecting conductor being provided in the dielectric element assembly on one side relative to a center in a width direction of the dielectric element assembly, the width direction being perpendicular or substantially perpendicular to the predetermined direction and to the direction of lamination; wherein
the dielectric element assembly includes a first region in which the first interlayer connecting conductor is provided and in which no interlayer connecting conductors are provided on the other side relative to the center in the width direction, and a second region in which no interlayer connecting conductors are provided;
in the first region, a portion of the signal line in a section that includes the first interlayer connecting conductor is positioned on the other side in the width direction relative to the center in the width direction of the dielectric element assembly; and
in the second region, the signal line includes a portion that is positioned to overlap with the center in the width direction of the dielectric element assembly.

* * * * *